United States Patent [19]

Uenoyama et al.

[11] Patent Number: 5,665,978
[45] Date of Patent: Sep. 9, 1997

[54] NONLINEAR ELEMENT AND BISTABLE MEMORY DEVICE

[75] Inventors: Takeshi Uenoyama, Kyoto; Yasuhito Kumabuchi, Osaka, both of Japan

[73] Assignee: Matsushita Electric Industrial Co., Ltd., Osaka, Japan

[21] Appl. No.: 653,639

[22] Filed: May 24, 1996

[30] Foreign Application Priority Data

May 25, 1995 [JP] Japan ................................. 7-126155

[51] Int. Cl.⁶ ............................ H01L 29/06; H01L 39/00
[52] U.S. Cl. ........................... 257/30; 257/25; 257/37; 365/159; 365/190
[58] Field of Search ............................ 257/25, 30, 37; 365/159, 189.09, 190

[56] References Cited

U.S. PATENT DOCUMENTS

| | | | |
|---|---|---|---|
| 3,239,821 | 3/1966 | Baker et al. | 365/159 |
| 3,329,823 | 7/1967 | Handy et al. | 257/30 |
| 3,445,733 | 5/1969 | Esaki et al. | 257/30 |
| 3,582,410 | 6/1971 | La Chapelle | 257/37 |
| 3,972,059 | 7/1976 | DiStefano | 357/6 |
| 4,300,212 | 11/1981 | Simko | 365/185 |
| 4,907,196 | 3/1990 | Mori et al. | 365/159 |
| 4,935,804 | 6/1990 | Ito et al. | 257/30 |

FOREIGN PATENT DOCUMENTS

| | | |
|---|---|---|
| 0 631 326 | 12/1994 | European Pat. Off. . |
| 0 697 741 | 2/1996 | European Pat. Off. . |
| 2 256 540 | 7/1975 | France . |
| 3-148183 | 6/1991 | Japan . |
| 95-254736 | 10/1995 | Japan ............................... 49/2 |

OTHER PUBLICATIONS

Chen et al, Monolithic Integration of Resonant Tunneling Diodes and FET's for Monostable-Bistable Transition Logic Elements (Mobile's), IEEE Electron Device Letters, vol. 16, No. 2, pp. 70–73 Feb. 1995.

Laibowitz et al., "Charge Storage on Small Metal Particles", Apr. 1971 Applied Physics Letters, vol. 18, No. 7, pp. 267–269.

Primary Examiner—Ngân V. Ngô
Assistant Examiner—Allan R. Wilson
Attorney, Agent, or Firm—McDermott, Will & Emery

[57] ABSTRACT

An n-type diffusion layer, an insulating layer and a first aluminum electrode are formed on a p-type silicon substrate. $Fe^{2+}$ (divalent Fe) having a vacant orbit not filled with an electron is implanted into a region of the insulating layer to form an impurity atom layer. A second aluminum electrode is formed which is in contact with the n-type diffusion layer. A voltage that increases the potential of the first aluminum electrode is applied between the first and second aluminum electrodes. The voltage is increased. In this situation, when the fermi level of the n-type diffusion layer and an impurity level which is the energy level for filling the vacant orbit of the $Fe^{2+}$ are matched, a resonance tunnelling current flows. Thereafter, when there is a change to the state of non-resonance state, a negative-resistance characteristic is exhibited in which the current decreases as the voltage is increased. Accordingly, the present invention is able to provide a low-power, low-voltage, fast nonlinear element that can well be incorporated into the integrated circuit, and a bistable memory device employing such an improved nonlinear element.

23 Claims, 17 Drawing Sheets

81a IMPURITY ATOM LAYER

Fig. 14(a)
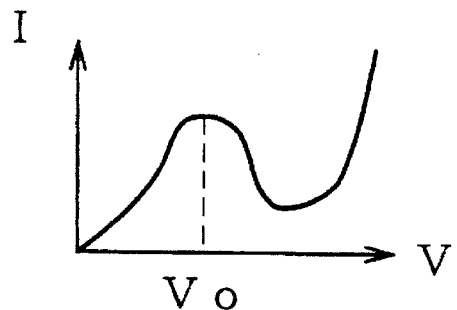
Vo DOES NOT VARY MUCH
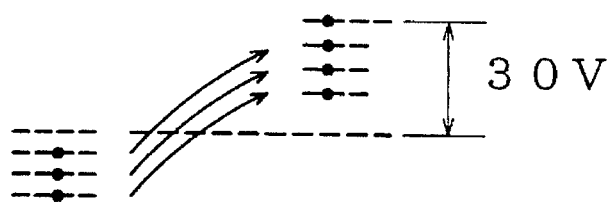
Fig. 14(b)
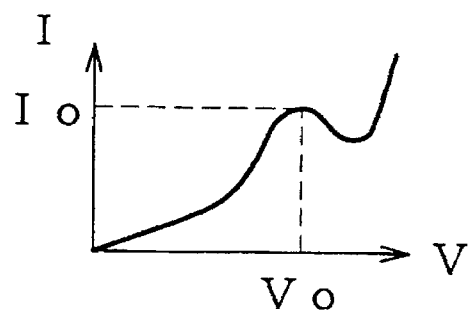
Vo VARIES GREATLY

NONLINEAR ELEMENT AND BISTABLE MEMORY DEVICE

BACKGROUND OF THE INVENTION

The present invention relates to an improved nonlinear element that makes utilization of tunnelling effects and to a bistable memory device formed by such a nonlinear element.

It has been known in the art that, even in such a situation that an insulating layer having a barrier level higher than the conductive level at which electrons can move is provided between two conductive layers, tunneling occurs so that electrons flow from one conductive layer to the other at a certain probability. If a voltage, applied between the conductive layers, is increased, then the possibility that electrons move likewise increases. As a result, the current flowing between the conductive layers increases. Further, if the voltage applied between the conductive layers goes up to above a certain voltage level, then the barrier level of the insulating layer lowers in effect, as a result of which diffusion current and FN tunnelling occur thereby increasing the current. This voltage-current characteristic that the current increases simply with the voltage is a basic characteristic exhibited in the usual conductor-insulator-conductor structure.

Nonlinear elements have been known in the art. A nonlinear element is one that has the nonlinear characteristic that the current does not increase simply with the voltage. Of various nonlinear elements a tunnel diode is a typical nonlinear element. The tunnel diode is described here. Both the impurity concentration of a p-type semiconductor layer and the impurity concentration of an n-type semiconductor on both sides of a semiconductor pn junction are made sufficiently high, to reduce the width of depletion layer. In this situation, a voltage in the forward direction is applied to the pn junction. The applied voltage is increased. When the applied voltage reaches a certain voltage level, the current reaches maximum value. Thereafter, if the applied voltage continues to increase, the current decreases (negative resistance). If the applied voltage is further increased, the current resumes increasing. In other words, the tunneling diode utilizes the phenomenon that tunnelling effects occur when the conduction band of the n-type semiconductor layer and the valence band of the p-type semiconductor layer are matched in energy level in a certain voltage range. Tunneling diodes find applications in bistable multivibrators and fast logic circuits because of their advantages such as fast switching characteristics.

However, there have been demands for faster elements for high-frequency signals of GHz or more, and for elements capable of being driven by a low voltage (several volts). Conventional tunnel diodes find it difficult to meet these requirements.

With a view to meeting the above noted requirements, an element is proposed which makes use of resonance tunnelling. For example, Japanese Patent Application (Pub. No. 3-148183) shows such a new element. In accordance with this application, an InAs oxide film, which acts as an insulating layer, is formed between InAs compound semiconductor layers. Quantum tunnelling by triangular potential, which occurs when the InAs substrates are matched in their quantum level, is utilized, to provide a semiconductor device having a nonlinear region in its voltage-current characteristic. Such a structure is implemented as follows. An InAs oxide film is formed on each InAs substrate and the InAs substrates are laminated together.

The above-described technique making use of resonance tunnelling resulting from a structure in which an insulating layer is just formed between compound semiconductor layers, however, has the following problems.

A resonance tunnelling phenomenon that occurs between quantum levels by the triangular potential of the compound semiconductor layers involves phonon scattering and therefore the probability that electrons move is as low as one resulting from simply applying a voltage to both sides of an insulating layer. The degree of nonlinearity exhibited in the voltage-current characteristic is extremely low, because of which the range of applications is limited.

The quantum level is likely to vary depending on the magnitude of applied voltage. If a slightly higher voltage is applied, this prevents a triangular potential from being formed therefore leading to the disappearance of the quantum levels. No resonance tunnelling occurs accordingly.

Although the use of compound semiconductors enables high-speed operations, they are expensive. Therefore, the application range is limited. Additionally, the fabrication process of the above-described technique may find it difficult to mount on the same semiconductor integrated circuit both nonlinear elements and transistors.

SUMMARY OF THE INVENTION

Bearing in mind the above-described problems with the prior art techniques, the present invention was made. It is therefore an object of the present invention to provide a fast, low-power nonlinear element capable of being easily built in integrated circuits, and to provide a bistable memory device using-such a nonlinear element. More specifically, the present invention uses the fact that in a transition metal the energy level for filling a vacant electron orbit in a certain shell is relatively low. The present invention provides a structure capable of permitting resonance tunnelling to occur between such an energy level and a layer that provides an electron. The present invention discloses a nonlinear element comprising:

a first conductive layer which has a first fermi level;

a second conductive layer which has a second fermi level at the same energy level as the first fermi level when no voltage is applied;

an insulating layer which is formed between the first and second conductive layers and which has a barrier level at an energy level higher than the first and second fermi levels when no voltage is applied;

an impurity layer;

said impurity layer being formed in said insulating layer;

said impurity layer containing an impurity element having in any of its shells a vacant orbit not filled with an electron;

said impurity layer having an impurity level that is an energy level for filling said vacant orbit and is higher than said first fermi level but lower than said barrier level;

wherein, when a given voltage is applied between the first and second conductive layers, an electron transfer occurs between the lower in voltage of the two conductive layers and the impurity layer by resonance tunnelling.

As a result of such arrangement, when the fermi level of the conductive layer on the low-voltage side and the impurity level are matched as the voltage is increased, electrons move from the conductive layer to the impurity layer by resonance tunnelling. Thereafter, the electrons further move from the impurity layer to the other conductive layer. In other words, the voltage-current characteristic between the first and second conductive layers has a nonlinear region where the current rapidly increases in a specific voltage range.

Such resonance tunnelling enables electrons to move fast, and resistance is extremely small thereby cutting down the power consumption. Additionally, since the impurity level is higher than the fermi levels of the first and second conductive layers when no voltage is applied, tunnelling other than resonance tunnelling hardly occurs. The aforesaid voltage used for causing a resonance tunnelling phenomenon can be held low by making adjustment between the fermi levels of the conductive layers and the impurity level or by selection of conductive layer material and the type of impurity element. The present invention is able to provide a simple, low-power, fast, low-voltage nonlinear element.

It is possible that in the above-described nonlinear element one of the first and second conductive layers is composed of a semiconductor and the other conductive layer is composed of a metal. In such a case it is preferred that the impurity layer is formed in close proximity to the aforesaid metallic conductive layer.

The aspect of such arrangements is explained. If a voltage is applied between these two conductive layers and if a high potential voltage is applied to the metallic conductive layer and is increased, then the impurity level drops with the fermi level of the metallic conductive layer. When the fermi level of the low-voltage side semiconductor conductive layer and the impurity level are matched, resonance tunnelling occurs, as a result of which the current is increased. If the voltage is further increased, the impurity level becomes lower than the fermi level of the semiconductor conductive layer, as a result of which the resonance tunnelling stops occurring and the current is decreased. If the voltage is further increased to practically reduce the barrier level of the insulating layer, then diffusion current and FN tunnelling occur, as a result of which the current is increased. On the other hand, if a low potential voltage is applied to the metallic conductive layer and is increased, an almost constant current flows after the occurrence of resonance tunnelling. Thereafter, the voltage increases with the current.

Here, the low potential voltage, which is applied to the semiconductor conductive layer, is defined as a positive voltage. In this case there exits a negative-resistance region in which, at positive voltages in a certain range, the current reaches maximum value due to resonance tunnelling and thereafter decreases as the voltage is increased. This semiconductor layer (first conductive layer)-insulating layer-metallic layer (second conductive layer) structure forms an MIS structure. Such an MIS structure can be realized in a semiconductor integrated circuit having many transistors. In accordance with the present invention, an impurity layer is formed in the insulating layer of MIS, which makes what neither a conventional MIS structure nor a conventional structure making use of compound semiconductor layers can achieve possible, in other words a nonlinear element exhibiting negative resistance can be incorporated into the semiconductor integrated circuit.

It is possible that both the first conductive layer and the second conductive layer are composed of metal.

As a result of such arrangement, if a positive voltage is applied to one of the conductive layers and is increased, the current becomes almost constant after resonance tunnelling occurs. Thereafter the current resumes increasing. The present invention provides a nonlinear element that has the characteristic that the current value is fixed in a certain voltage range. Additionally, such an MIM structure can easily be realized in a semiconductor integrated circuit formed by a single-level polysilicon process or by a double-level polysilicon process.

Both the first conductive layer and the second conductive layer may be formed of semiconductor.

The aspect of such arrangement is as follows. By adequately controlling the conductive type and concentration of impurity for each conductive layer in the semiconductor substrate, it becomes possible to provide a nonlinear element that exhibits a voltage-current characteristic in which there exists a voltage range that exhibits the negative resistance, regardless of which type of voltage is applied to one of the conductive layers, a positive voltage or negative voltage.

It is preferred that the impurity element has a stronger ionization tendency than a material forming the insulating layer.

Accordingly, electrons can move from the conductive layer to the impurity layer without being absorbed by the insulating layer. This ensures that resonance tunnelling occurs without fail.

In view of production facility and stability, it is preferred that the insulating layer is composed of at least one of oxide, nitride and fluoride.

It is preferred that the impurity element is a transition metal.

A transition metal is the metal having an orbit not filled with an electron in the d shell or in the f shell and becomes positive ions of plural types (for example, monovalent and divalent ions, and divalent and trivalent ions). The energy gap between positive ions of different valences is small. Therefore it is possible to reduce the difference between voltage at which resonance tunnelling occurs and voltage at which no resonance tunnelling occurs by making use of a transition from one positive ion to another. Since it is possible to create a nonlinear characteristic in the voltage-current characteristic with a low voltage, a nonlinear element capable of suitably being incorporated in the semiconductor integrated circuit can be obtained.

It is possible that the insulating layer and the impurity layer are formed by ion implantation or by CVD.

The present invention provides a bistable memory device comprising a load element and a drive element wherein the load and drive elements are arranged in series in that order between a first power source for supplying of a higher voltage and a second power source for supplying a lower voltage, the drive element including:
  a first conductive layer which has a first fermi level;
  a second conductive layer which has a second fermi level at the same energy level as the first fermi level when no voltage is applied and which is connected to the load element;
  an insulating layer which is formed between the first and second conductive layers and which has a barrier level at an energy level higher than the first and second fermi levels when no voltage is applied;
  an impurity layer;
  said impurity layer being formed in said insulating layer;
  said impurity layer containing an impurity element having in any of its shells a vacant orbit not filled with an electron;
  said impurity layer having an impurity level which is an energy level for filling said vacant orbit and is higher than said first fermi level but lower than said barrier level wherein, when a voltage that increases the potential of the second conductive layer is applied between the first and second conductive layers and is increased, a negative-resistance characteristic, associated with a transition from the state of resonance to the state of non-resonance between the first conductive layer and the impurity layer, is exhibited in a specific voltage range;

wherein the voltage of an intermediate point between the drive element and the load element is one of voltages at two stable points corresponding to intersections of voltage-current characteristic curves of the drive and load elements.

Accordingly it becomes possible, by making use of a nonlinear element having the negative resistance characteristic caused by resonance tunnelling, to store states at the two stable points as data 0 or as data 1. The present invention provides a bistable element equivalent to SRAM that can be formed by an extremely small number of elements.

It is possible that the first conductive layer of the drive element is composed of a semiconductor and the second conductive layer of the drive element is composed of a metal. In such a case it is preferred that the impurity layer of the drive element is formed closer to the second conductive layer than to the first conductive layer.

As a result of such arrangement, the drive element comes to exhibit negative resistance in a certain voltage range. This facilitates control of the characteristics of the drive and load elements in order that two stable intersections are obtained between the voltage-current characteristic curve of the drive element and the voltage-current characteristic curve of the load element.

It is possible that the load element has a first conductive layer, a second conductive layer, an insulating layer, and an impurity layer so that the load element becomes identical in structure with the drive element.

Accordingly, two nonlinear elements having the same structure are formed on a single semiconductor substrate, whereupon a bistable memory device is obtained. Since the drive element and the load element each have an MIS structure, this provides a bistable memory device which can be built in the semiconductor integrated circuit and which is suitable for mass production.

It is possible that the first conductive layer of the load element is connected to the first power source and the second conductive layer of the load element is connected to the second conductive layer of the drive element.

As a result of such arrangement, a high potential voltage is applied to the first conductive layer of the load element. Therefore, a region of the voltage-current characteristic curve of the load element, in which the voltage is negative, becomes a load curve. Of intersections of (A) the load curve having a region in which the current becomes almost constant for voltage increase in the negative direction and (B) the voltage-current characteristic curve of the drive element with a negative-resistance characteristic, two intersections, at which the differential coefficient is positive, each become a bistable point.

It is possible that the second conductive layer of the load element is connected to the first power source and the first conductive layer of the load element is connected to the second conductive layer of the drive element.

As a result of such arrangement, a high potential voltage is applied to the second conductive layer of the load element. Therefore, a region of the voltage-current characteristic curve of the load element, in which the voltage is positive, becomes a load curve. Of intersections of (A) the load curve having a region that exhibits negative resistance for voltage increase in the negative direction and (B) the voltage-current characteristic curve of the drive element having negative-resistance, two intersections, at which the differential coefficient is positive, each become a bistable point.

Each of the above-described arrangements ensures that bistable points are obtained. This further ensures that the bistable memory device of the present invention performs the function of holding data.

The first and second conductive layers of the drive element may be composed of semiconductor. In such a case it is possible that the load element has a first conductive layer, a second conductive layer, an insulating layer, and an impurity layer so that the load element becomes identical in structure with the drive element.

Such arrangement ensures that bistable points are obtained. This further ensures that the bistable memory device of the present invention performs the function of holding data.

The load element may be formed of a resistor.

As a result of such arrangement, of intersections of (A) a region of the voltage-current characteristic curve of the drive element that exhibits negative resistance and the straight load curve, two intersections, at which the differential coefficient is positive, each become a bistable point. This ensures that bistable points are obtained and that the bistable memory device of the present invention performs the function of holding data.

BRIEF DESCRIPTION OF THE DRAWINGS

FIGS. 14(a) and 14(b) each show the relationship between energy necessary for filling the impurity level of an impurity atom layer and V-I characteristic.

DETAILED DESCRIPTION OF THE INVENTION

Embodiment 1

Figure 1:
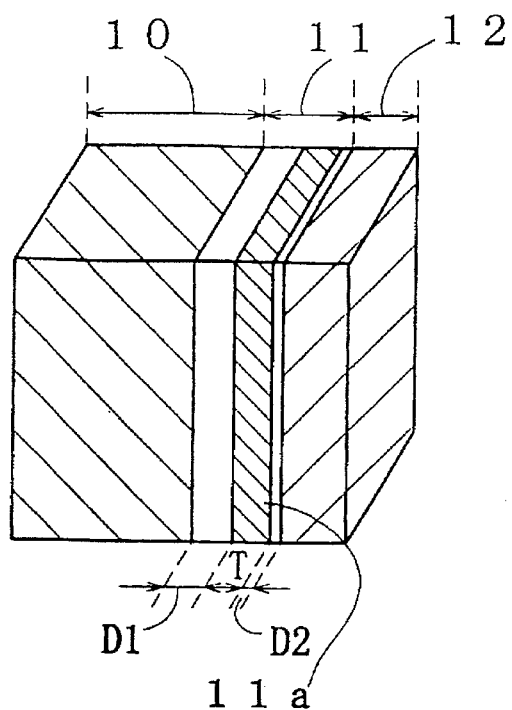
FIG. 1 is a perspective view showing the basic structure of a nonlinear element in accordance with a first embodiment of the present invention.

FIG. 1 is a perspective view which roughly illustrates a nonlinear element of the first embodiment of this invention. The nonlinear element has a semiconductor layer 10 which is a first conductive layer, a metallic layer 12 which is a second conductive layer, and an insulating layer 11 which is formed between the semiconductor layer 10 and the metallic layer 12. Additionally, the nonlinear element has an impurity atom layer 11a. This impurity atom layer 11a is formed by introducing impurity atoms into a region of the insulating layer 11 having a thickness of T. As can be seen from the figure, there is a fixed distance, D1, between the impurity atom layer 11a and the semiconductor layer 10 and there is an extremely short distance, D2, between the impurity atom layer 11a and the metallic layer 12.

Figure 2:
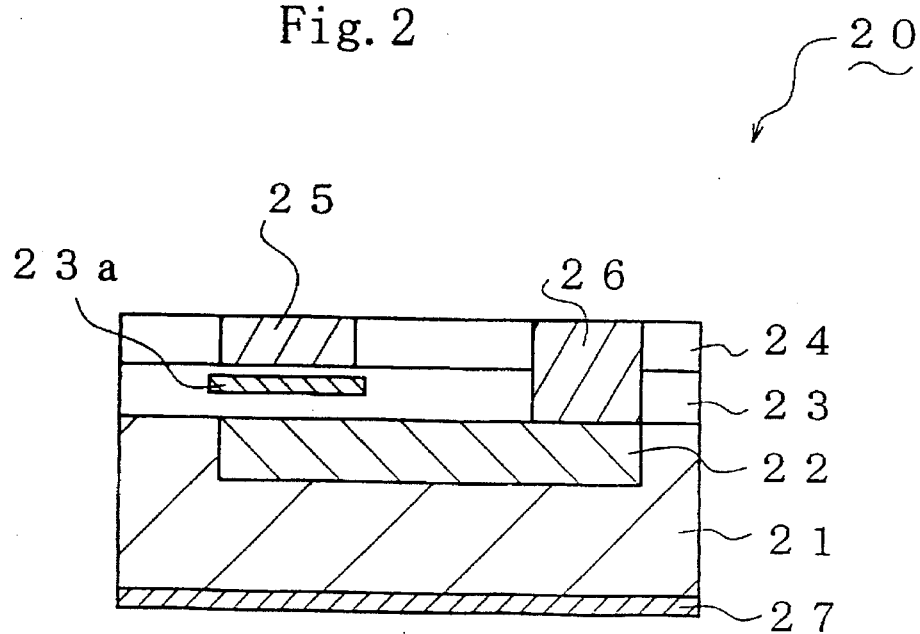
FIG. 2 is a cross-sectional view concretely showing the structure of a nonlinear element formed on the substrate of the first embodiment.

FIG. 2 shows in cross section a nonlinear element 20 formed on a semiconductor substrate 21 of p-type silicon. 22 is an n-type diffusion layer which is a semiconductor layer formed by introducing n-type impurities into an upper surface region of the p-type silicon substrate 21. An insulating layer 23 of $SiO_2$ is formed over the n-type diffusion layer 22. A first electrode 25 of aluminum, which is a metallic layer, is formed on the insulating layer 23a is an impurity atom layer formed by means of doping of impurity atoms of iron ($Fe^{2+}$) into the insulating layer 23. This impurity atom layer 23a lies near the upper surface of the insulating layer 23, in other words it is formed apart from the n-type diffusion layer 22 but in very close proximity to the first aluminum electrode 25. There exists a vacant orbit, not filled with an electron, in the 3d shell of a divalent ion of Fe ($Fe^{2+}$), which is described in detail later and the impurity atom layer 23a has an energy level for filling such a vacant orbit with an electron (hereinafter called the impurity level). 26 is a second electrode of aluminum formed by continuously depositing aluminum in a contact hole defined in a region of the insulating layer 23 and above the contact hole. There is an ohmic contact between the second aluminum electrode 26 and the n-type diffusion layer 22. An $SiO_2$ passivation film 24 is sandwiched between the first and second electrodes 25 and 26. 27 is a backside electrode of p-type polysilicon formed on the backside of the p-type silicon substrate 21. This backside electrode 27 is coupled to ground.

The thickness of the first aluminum electrode 25 is 2 μm. The insulating layer 23 has a thickness of 5 nm. The impurity concentration of the impurity atom layer 23a is approximately $10^{17}$ $cm^{-3}$. Within the insulating layer 23, there is a distance of about 3 nm between the impurity atom layer 23a having a thickness of about 1 nm and the n-type diffusion layer 22, in other words the impurity atom layer 23a lies only about 1 nm from the first aluminum electrode 25. The layer 23a and the electrode 25 are in very close proximity to each other. The n-type impurity concentration of the n-type diffusion layer 22 is $10^{18}$ $cm^{-3}$.

Ions of iron ($Fe^{2+}$) are implanted by ion implantation into the insulating layer 23, to form the impurity atom layer 23a. The usefulness of the ion implantation process is as follows. One advantage is that the depth of implantation becomes controllable by implantation energy adjustment. Another advantage is that the dose of impurity can be controlled accurately. Still another advantage is that, since the number of atoms with movable electrons can be determined by the impurity dose, the amount of current can be controlled by the impurity dose.

The impurity atom layer 23a may be formed by CVD and sputtering methods. The impurity atom layer 23a is not necessarily formed within the insulating layer 23 in an enclosed manner. For example, the impurity atom layer 23a may be formed across the entire surface of the insulating layer 23.

The basic operation principle of the present nonlinear element is now described. Here, the variation in current, caused by application of a voltage between the semiconductor layer 10 and the metallic layer 12, is explained (see FIG. 3(a)). The voltage on the side of the metallic layer 12, when it has a high potential, is defined as a positive voltage. Referring to FIGS. 3(b)–3(d), the relationship between through current passing through each layer and applied voltage is described. FIGS. 3(b)–3(d) are energy band diagrams each showing the variation in energy level of each layer when the voltage between the layers is made to vary. FIG. 4 is a characteristic diagram showing variation in current I for variation in voltage V between each layer.

AS shown in FIG. 3(b), when the voltage between each layer is zero, in other words when no voltage is applied, EF1 and EF2, respectively the fermi level of the semiconductor layer 10 and the fermi level of the metallic layer 12, are in the state of equilibrium. The impurity atom layer 11a has an impurity level of Eva higher than EF1 and EF2. In this situation almost no electric charges move from the semiconductor layer 10 into the impurity atom layer 11a. In effect no electric current flows between the layers.

However, as the positive voltage is gradually increased, EF2 decreases together with Eva. When EF1 and Eva move nearer to each other, tunnelling occurs between the semiconductor layer 10 and the impurity atom layer 11a, whereupon the tunnel current increases. As shown in FIG. 3(c), when Eva and EF1 are matched when the voltage V between the electrodes is a given value of V0, many electrons make the transition from the semiconductor layer 10 to the impurity atom layer 11a by resonance tunneling (see range Ra1 of FIG. 4). Electrons can easily move from the impurity atom layer 11a to the metallic layer 12 so that once resonance tunnelling occurs an electric current increasingly flows between the electrodes, reaching a maximum value of I0.

As shown in FIG. 3(d), if the voltage V is further increased, this causes a shift between Eva and EF1. As a result, Eva and EF1 enter their non-resonance state. Even in such a non-resonance state, it is easy for the electrons to move from the impurity atom layer 11a to the metallic layer 12. However, the amount of electric current flowing from the semiconductor layer 10 to the impurity atom layer 11a rapidly decreases. Therefore the current flowing between the electrodes is decreased. This non-linear element exhibits the negative resistance characteristic that as the voltage is increased in a certain voltage range the current decreases (see range Ra2 of FIG. 4).

If the voltage V is further increased, this reduces the difference between EF1 and the barrier of the insulating layer 11. In other words the height of the barrier by the insulating layer 11 is in effect reduced so that diffusion current flows and FN tunnelling results. As a result, the current I resumes increasing (see range Ra3 of FIG. 4).

When a negative voltage is applied (i.e., a high potential voltage is applied to the semiconductor layer 10 while a low potential voltage is applied to the metallic layer 12) and is increased gradually, EF2 becomes high while on the other hand EF1 becomes low. As a result, electrons in the metallic layer 12 move through Eva into the semiconductor layer 10 by tunnelling and, at the beginning, characteristics opposite to Ra1 of FIG. 4 are shown. That is, the negative current I gradually increases (see range Ra4 of FIG. 4).

If the negative voltage is made further greater, then EF2 becomes high. When EF2 and part of Eva are matched, resonance tunnelling occurs. There exist in the metallic layer 12 many electrons of lower level than EF2. Therefore, once resonance tunnelling occurs the electrons move to the semiconductor layer 10 by a given amount, as a result of which the amount of the current I becomes constant (see range Ra5 of FIG. 4). The current value is determined by the probability that electrons move from Eva to the semiconductor layer 10, and the distance between the impurity atom layer 11a and the n-type semiconductor layer 10 is relatively great, so that the amount of the current I will not increase much.

If the negative voltage is further increased, the barrier of the insulating layer 11 against EF2 is in effect lowered. In addition to this, FN tunneling occurs. The amount of the current I increases in the negative direction (see range Ra6).

The present nonlinear element exhibits the negative resistance characteristic in range Ra2 on the positive side of the voltage V, when the voltage V is applied between the semiconductor layer 10 and the metallic layer 12. In the other ranges Ra1 and Ra3, the present nonlinear element exhibits the characteristic that the current value increases with the voltage. On the negative side of the voltage V the present nonlinear element exhibits the characteristic that the current value is fixed in range Ra5 while in the other ranges Ra4 and Ra6 it exhibits the characteristic that the current value increases with the voltage. To sum up, the present embodiment provides an element having the nonlinear characteristic.

A way of applying a voltage is now described. For the case of the nonlinear element 20 formed on the semiconductor substrate shown in FIG. 2, a voltage is applied between the n-type diffusion layer 22 which is a semiconductor layer and the first aluminum electrode 25 which is a metallic layer. However, in practice the voltage is applied through the second aluminum electrode 26 to the n-type diffusion layer 22. Suppose here that the voltage when the potential of the first aluminum electrode 25 becomes high is defined as a positive voltage. In such a case, if a positive voltage is applied, then electron flow from the n-type diffusion layer 22 to the first aluminum electrode 25, mainly by resonance tunnelling. The current flows from the first aluminum electrode 25 to the second aluminum electrode 26. On the other hand, if a negative voltage is applied, then the current flows from the second aluminum electrode 26 to the first aluminum electrode 25.

The I-V (current-voltage) characteristic of the present nonlinear element makes it possible to provide a semiconductor device with negative resistance. For example, in the FIG. 4 V-I characteristic it is possible to have I0 (the maximum value of the current I) become 1 nA when V0 (the maximum value of the voltage V)=1 V. The present embodiment makes utilization of tunnelling effects to discrete quantum level, so that it can provide a nonlinear element whose operating voltage/current is low in comparison with conventional tunnel diodes. The present nonlinear element is a low-power element and can operate at an extremely high speed without using a special semiconductor substrate such as a compound semiconductor substrate. For example, the present nonlinear element may be used as a switching element of THz order. In the present embodiment, resonance tunnelling occurring between Eva and the semiconductor layer is utilized for providing inexpensive nonlinear elements capable of being incorporated in semiconductor integrated circuits and capable of operating at a high speed at a low voltage.

Embodiment 2

A nonlinear element in accordance with the second embodiment is described. The present nonlinear element differs from the first embodiment's non linear element in that both the first and second conducive layers are metallic layers.

Figure 5:
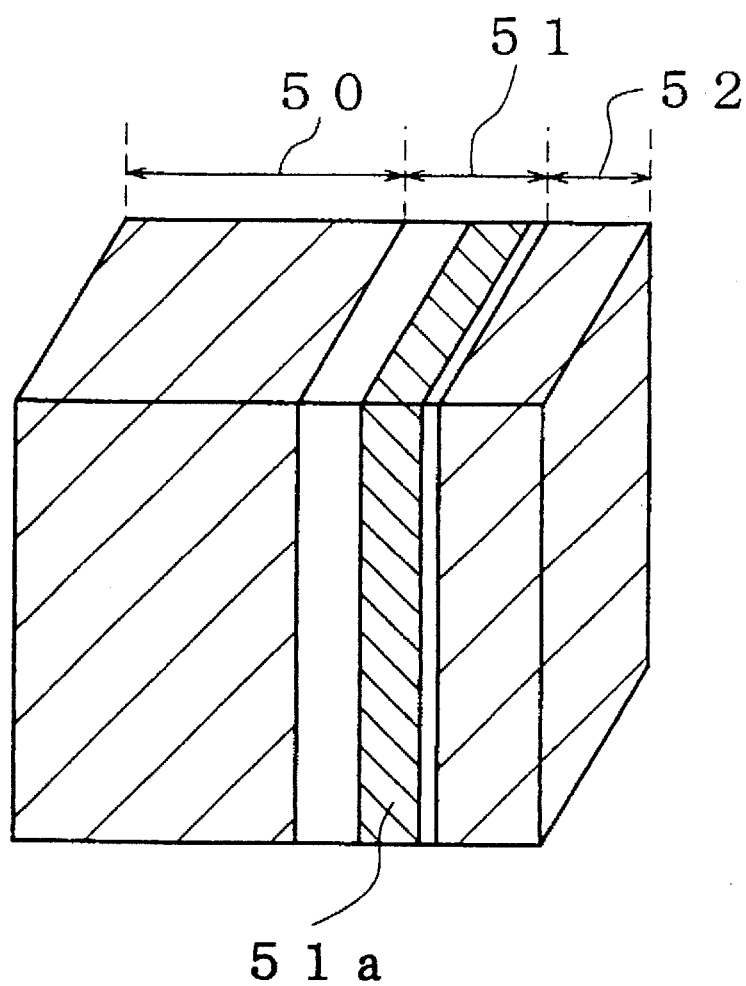
FIG. 5 is a perspective view showing the basic structure of a nonlinear element in accordance with a second embodiment of the present invention.

FIG. 5 shows in cross section the basic structure of a nonlinear element made in accordance with the present embodiment. An insulating layer 51 is provided between a first metallic layer 50 and a second metallic layer 52. Formed within the insulating layer 51 is an impurity atom layer 51a formed by introduction of metal impurities having an impurity level. More specifically, this impurity atom layer 51a is formed by doping of atoms of iron($Fe^{2+}$), as impurity atoms, into the insulating layer 51. The impurity atom layer 51a is not in direct contact with the first and second metallic layers 50 and 52. The impurity atom layer 51a is formed in close proximity to the second metallic layer 52. However, the impurity atom layer 51a may be formed near the first metallic layer 50 or may be located somewhere between the metallic layers 50 and 52.

Figure 6A:
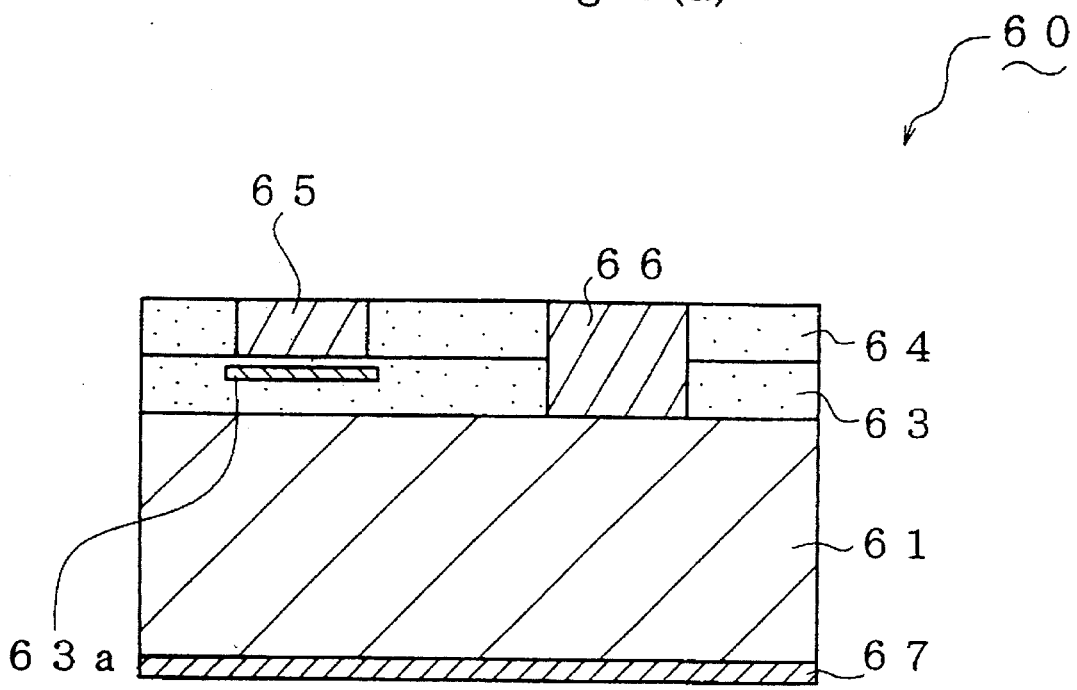
FIGS. 6(a) and 6(b) respectively show a nonlinear element of the second embodiment and its modified example.

Referring now to FIG. 6(a), a nonlinear element 60 of the present embodiment is described. An insulating layer 63 of $SiO_2$ is formed on an aluminum substrate 61 which is a first metallic layer. A first aluminum electrode 65, which is a second metallic layer, is formed on the insulating layer 63. A portion of the aluminum substrate 61 is in contact with a second aluminum electrode 66. Sandwiched between the first aluminum electrode 65 and the second aluminum electrode 66 is a passivation film 64. A backside electrode 67 is formed on the backside of the aluminum substrate 61. The p-type silicon substrate 21 of the first embodiment is replaced by the aluminum substrate 61 in the present embodiment.

Figure 6B:
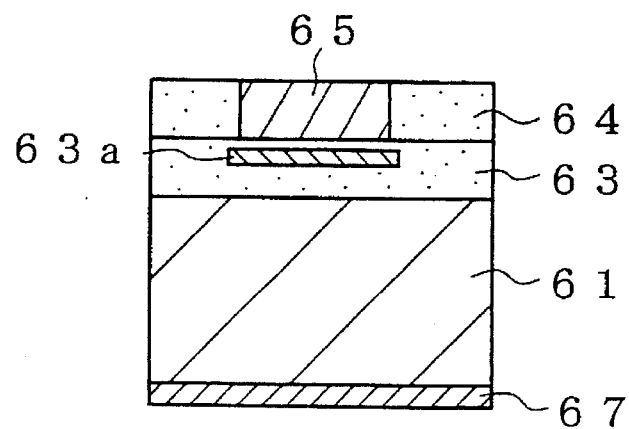

FIG. 6(b) shows a modified example of the present embodiment. In this example the second aluminum electrode 66 is not provided and the aluminum substrate 61 acts as an electrode. Therefore, when the substrate is formed of metal, the provision of the second aluminum electrode 66 is not always necessary.

Figure 7A:
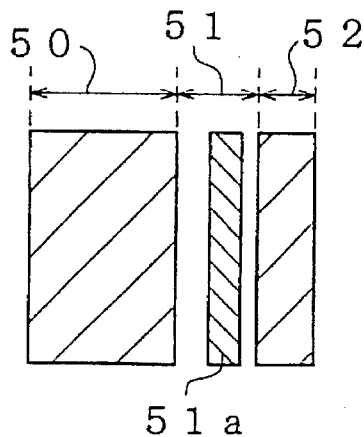
FIGS. 7(a)–7(d) are diagrams including a basic structure diagram and energy band diagrams useful in understanding the operation principle of a nonlinear element of the second embodiment.
Figure 7B:
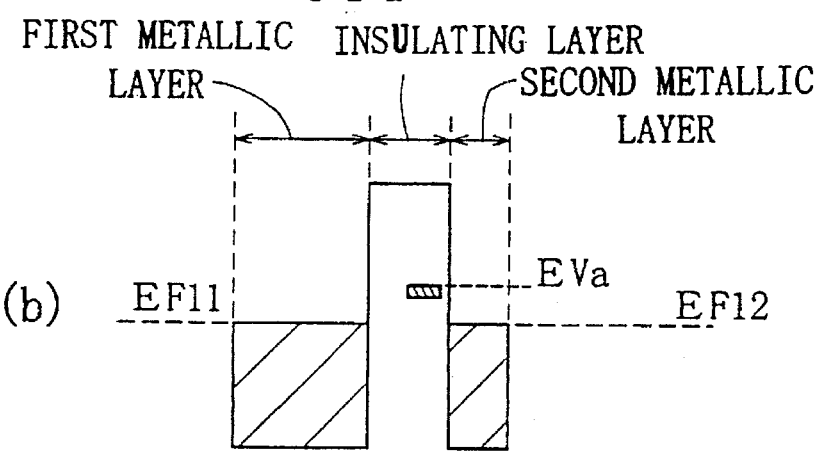
Figure 7C:
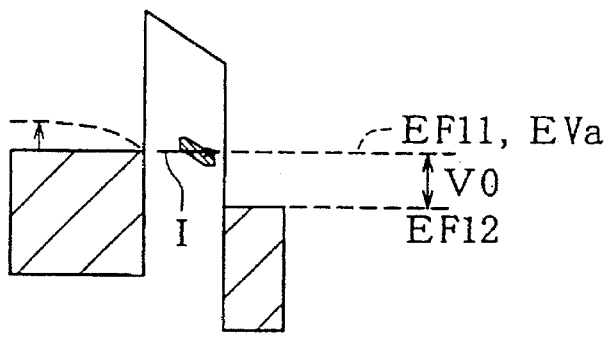
Figure 7D:
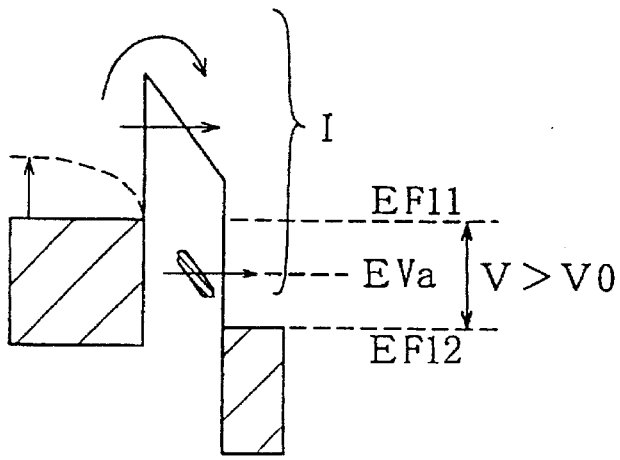
Figure 8:
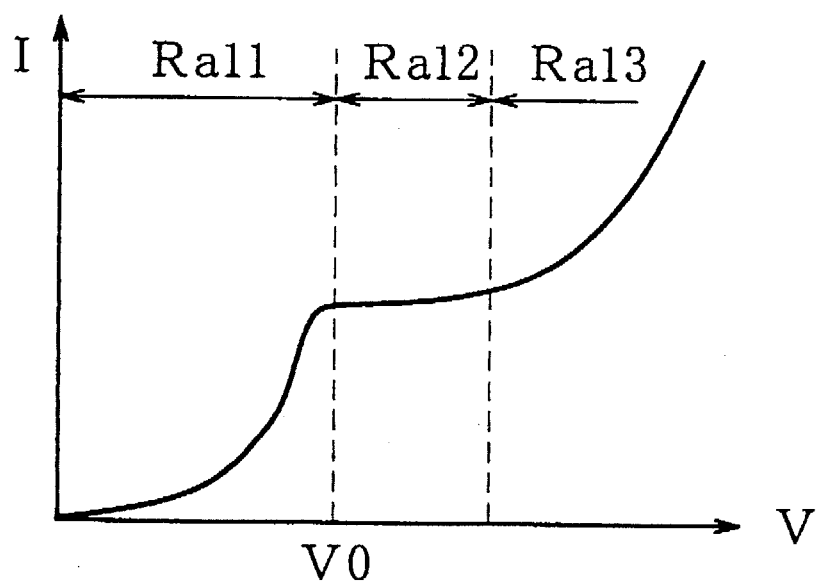
FIG. 8 shows the V-I characteristic of a nonlinear element of the second embodiment.

Next, the operation principle of the present nonlinear element is explained. Here, the variation in current, caused by application of a voltage between the first metallic layer 50 and the second metallic layer 52, is explained (see FIG. 7(a)). The voltage on the side of the second metallic layer 52, when it has a high potential, is defined as a positive voltage. Referring to FIGS. 7(b)-(d), the relationship between through current passing through each layer and applied voltage is described. FIGS. 7(b)-(d) are energy band diagrams each showing the variation in energy level of each layer when the voltage between the layers is made to vary. FIG. 8 is a characteristic diagram showing variation in current I for variation in voltage V between each layer.

As shown in FIG. 7(b), when the voltage between each layer is zero, in other words when no voltage is applied, EF11 and EF12, respectively the fermi level of the first metallic layer 50 and the fermi level of the second metallic layer 52, are in the state of equilibrium. The impurity atom layer 51a has Eva (the impurity level) higher than EF11 and EF12. In such a situation almost no electric charges move from the first metallic layer 50 into the impurity atom layer 51a. No electric current practically flows between the layers.

As the positive voltage is gradually increased, EF12 decreases together with Eva. As a result, EF11 and Eva move nearer to each other and electrons pass through the insulating layer 51 between the first metallic layer 50 and the impurity atom layer 51a by tunnelling effects, whereupon the tunnel current increases. As shown in FIG. 7(c), when Eva corresponds to EF11 when the voltage V between the electrodes is a given value of V0, electrons make the transition from the first metallic layer 50 to the impurity atom layer 51a by resonance tunneling. An electric current increasingly flows between the electrodes (see range Ra11 of FIG. 8).

If the applied voltage is increased, then Eva and EF11 come to disagree in energy level. However, since there exist many electrons in the first metallic layer 50 having an energy level lower than EF11, this maintains the resonance state for a long period of time. The value of the current I becomes almost constant (see range Ra12 of FIG. 18).

If the voltage V is further increased, this reduces the difference between EF11 and the barrier of the insulating layer 51. In other words the height of the barrier by the insulating layer 51 is in effect reduced so that diffusion current flows and, in addition, FN tunnelling results. As a result, the current I increases (see range Ra13 of FIG. 8).

When a negative voltage is applied in the present embodiment (i.e., when a plus voltage is applied to the first metallic layer 50 and a minus voltage is applied to the second metallic layer 51), a characteristic is obtained which basically has a reverse pattern of a characteristic shown on the side where the voltage is positive (see FIG. 8)

Like the first embodiment's nonlinear element, the present nonlinear element has the characteristic that the current increases rapidly when the voltage=V0. However, when the voltage is above V0, the present nonlinear element exhibits no negative resistance characteristics but has the tendency that the current gradually increases as the voltage is increased. To sum up, the present nonlinear element, although it has no negative resistance characteristics, has the nonlinear characteristic that the value of the current becomes almost constant on the midway.

The present nonlinear element has a structure that is formed by forming an impurity layer in the insulating layer of MIM. Such a structure may easily be incorporated into a semiconductor integrated circuit containing MOS transistors fabricated by double-level polysilicon processing and may easily be achieved by forming, for example, an aluminum interconnection line on a polysilicon film.

Embodiment 3

A nonlinear element of a third embodiment of the present invention is described. The nonlinear element of the present embodiment is characterized in that both the first and second conductive layers are formed of semiconductor.

Figure 9:
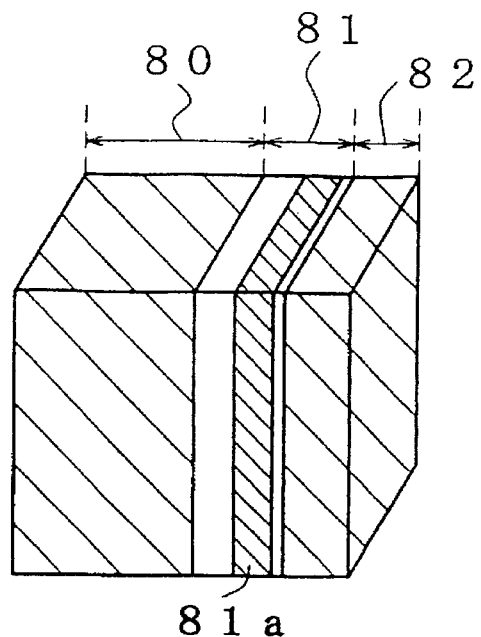
FIG. 9 is a perspective view showing the basic structure of a nonlinear element in accordance with a third embodiment of the present invention.

As shown in FIG. 9, the present nonlinear element has a first semiconductor layer 80 of the n type, a second semiconductor layer 82 of the n type, and an insulating layer 81 placed between the first and second semiconductor layers 80 and 82. Additionally, formed within the insulating layer 81 is an impurity atom layer 81a implanted with a metal having an impurity level. In FIG. 9 the impurity atom layer 81a is formed near the second semiconductor layer 82. The impurity atom layer 81a may be formed anywhere in the insulating layer 81.

Figure 10:
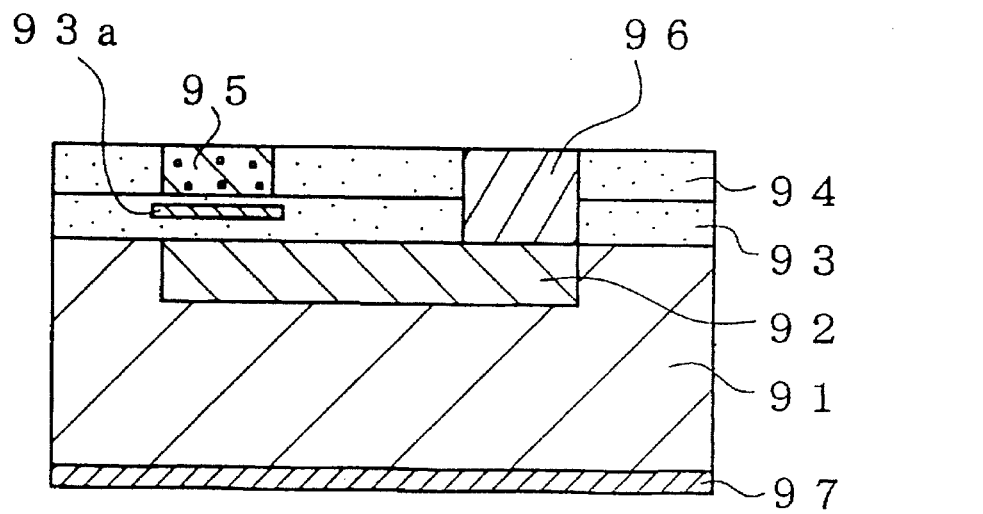
FIG. 10 shows in cross section a nonlinear element formed on the substrate of the third embodiment.

FIG. 10 shows in cross section a nonlinear element 90 formed on a semiconductor substrate 91 of p-type silicon. 92 is an n-type diffusion layer which is a first semiconductor layer formed by-introducing n-type impurities into an upper surface region of the p-type silicon substrate 91. An insulating layer 93 of $SiO_2$ is formed over the n-type diffusion layer 92. A silicon electrode 95, as a second semiconductor layer implanted with n-type impurities, is formed on the insulating layer 93. 93a is an impurity atom layer formed by means of doping of impurity atoms of iron ($Fe^{2+}$) into the insulating layer 93. 96 is a second electrode of aluminum in ohmic contact with a part of the insulating layer 93. 94 is an $SiO_2$ passivation film. 97 is a backside electrode of p-type polysilicon. The present nonlinear element differs from the first embodiment's nonlinear element as follows. In the former the silicon electrode 95 is formed as a second conductive layer while in the latter the aluminum electrode is formed as a second conductive layer.

Figure 11A:
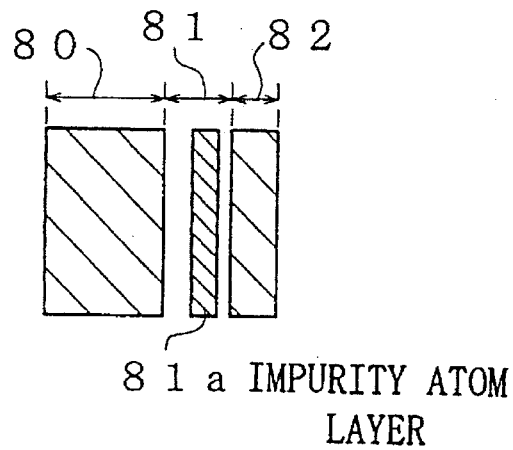
FIGS. 11(a)–11(d) are diagrams including a basic structure diagram and energy band diagrams useful in understanding the operation principle of a nonlinear element of the third embodiment.
Figure 11B:
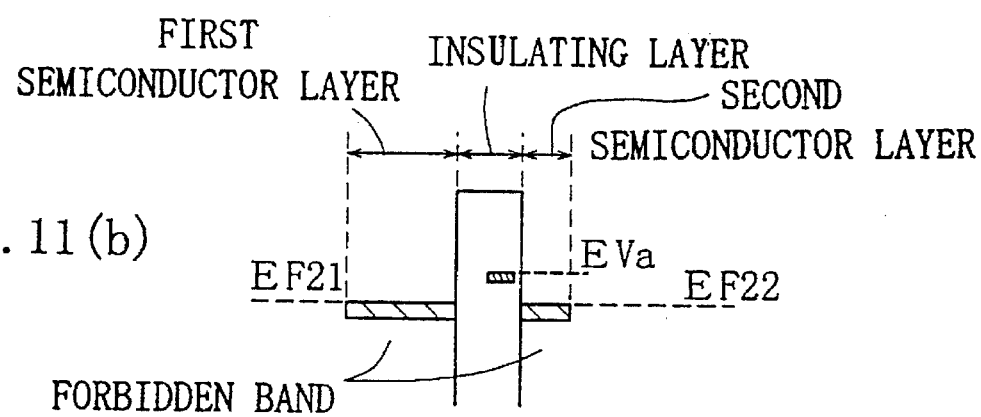
Figure 11C:
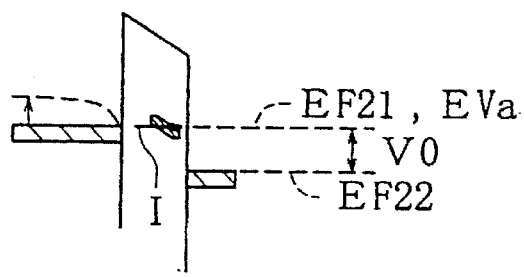
Figure 11D:
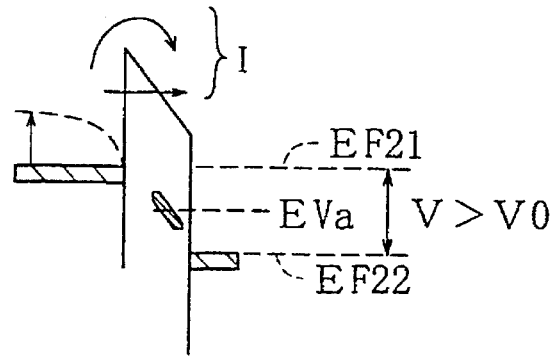
Figure 12A:
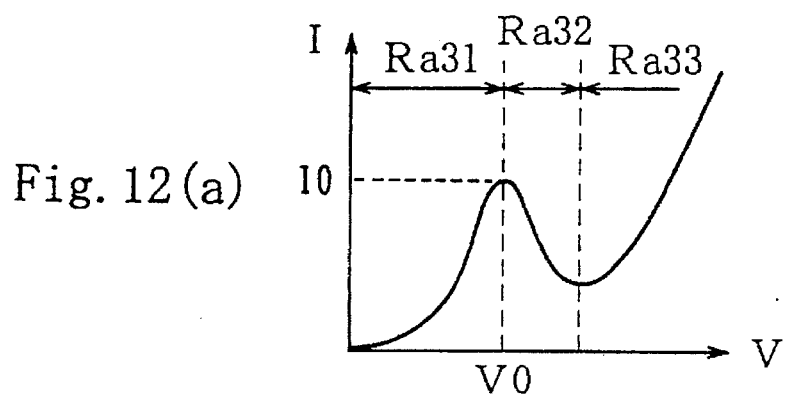
FIGS. 12(a)–12(c) are diagrams showing the V-I characteristics of nonlinear elements of the third embodiment.

The basic operation principle of the present nonlinear element is now explained. As shown in FIG. 11(a), a voltage is applied between the first semiconductor layer 80 (the first conductive layer) and the second semiconductor layer 82 (the second conductive layer). The voltage on the side of the second semiconductor layer 82, when it has a high potential, is defined as a positive voltage. The relationship between through current passing through each layer and applied voltage is described referring to FIGS. 11(b)-(d) and to FIG. 12(a). The impurity atom layer 81a is formed near the second semiconductor layer 82 in the insulating layer 81. FIGS. 11(b)-(d) are energy band diagrams showing the variation in energy level of each layer when the voltage between each layer is made to vary. FIG. 12(a) is a characteristic diagram showing the variation in current I for the variation in voltage V between each layer in the positive direction.

As shown in FIG. 11(b), when the voltage between each layer is zero, in other words when no voltage is applied, EF21 and EF22, respectively the fermi level of the first semiconductor layer 80 and the fermi level of the second semiconductor layer 82, are in the state of equilibrium. The impurity atom layer 81a has an impurity level of Eva higher than EF21 and EF22. In such a situation almost no electrons move from the first semiconductor layer 80 into the impurity atom layer 81a. Practically, no electric current flows between the layers.

As the positive voltage is gradually increased, EF22 decreases together with Eva. As a result, EF21 and Eva move nearer to each other and electrons pass through the insulating layer 81 sandwiched between the first semiconductor layer 80 and the impurity atom layer 81a by tunnelling effects, whereupon the tunnel current increases.

As shown in FIG. 11(c), when Eva comes to correspond to EF21 when the voltage V between the electrodes has a given value of V0, electrons make the transition from the first semiconductor layer 80 to the impurity atom layer 81a by resonance tunneling, as a result of which electric current rapidly flows between the electrodes, reaching a maximum value of IO (see range Ra31 of FIG. 12(a)).

As shown in FIG. 11(d), if the applied voltage is further increased, this causes a shift between Eva and EF21. As a result, Eva and EF21 enter their non-resonance state and the amount of electric current flowing between them decreases (see range Ra32 of FIG. 12(a)). Therefore, it is observed that this non-linear element exhibits the negative resistance characteristic.

If the applied voltage is further increased, this reduces the difference between EF21 and the barrier of the insulating layer 81. In other words the height of the barrier by the insulating layer 81 is in effect reduced so that diffusion current flows and FN tunnelling results. As a result, the current I resumes increasing (see range Ra33 of FIG. 12(a)).

As can be seen from FIG. 12(a), the present nonlinear element exhibits basically the same V-I characteristic with respect to the positive voltage as the first embodiment nonlinear element does. However, the present nonlinear element and the first embodiment nonlinear element exhibit different V-I characteristics with respect to the negative voltage, which is described later.

In accordance with the present embodiment, both the first and second conductive layers with the insulating layer therebetween are formed of n-type semiconductor. In the case of the impurity atom layer 81a being arranged at the center of the insulating layer 81, each range Ra34, Ra35, Ra36 for the negative voltage shows an I-V characteristic the basic shape of which is symmetrical in the origin with an I-V characteristic of each range Ra31, Ra32, Ra33 for the positive voltage. If the impurity atom layer 81a is shifted towards the semiconductor layer 80 or towards the semiconductor layer 82, this reduces the peak value of the I-V characteristics.

Figure 12B:
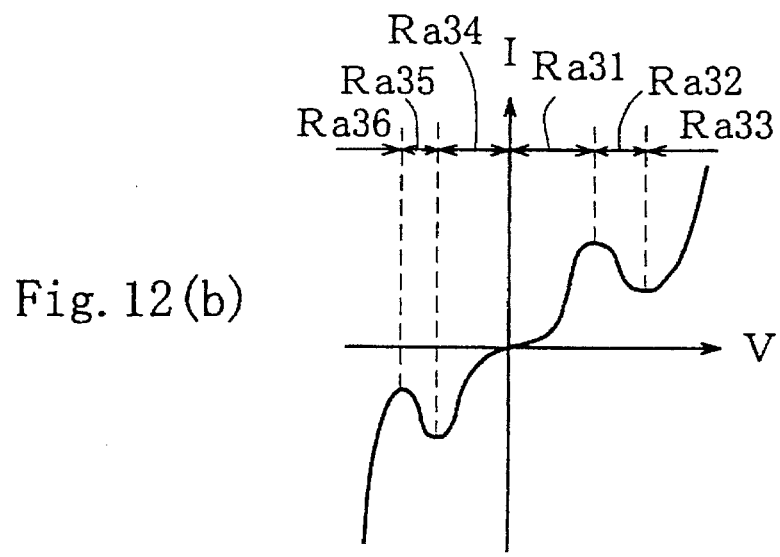
Figure 12C:
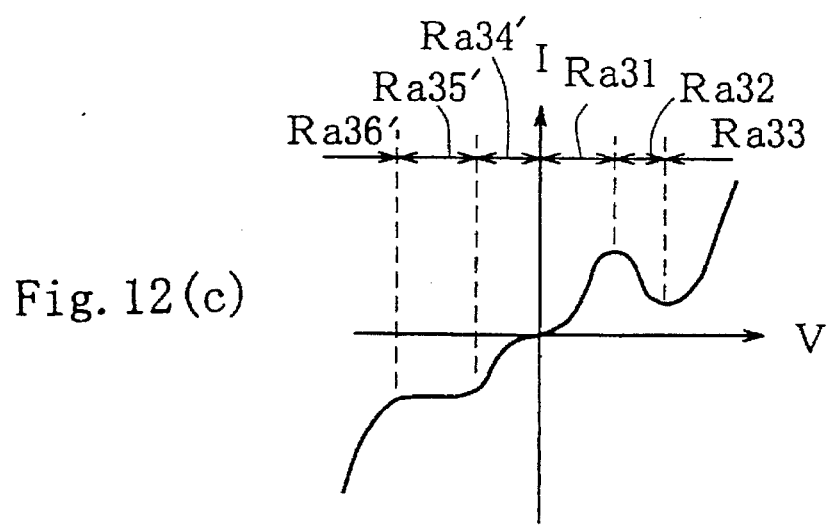

FIG. 12(c) shows an I-V characteristic in the case of the impurity atom layer 81a being formed in such a manner as to establish contact with the second semiconductor layer 82. When the voltage V is positive, basically the same I-V characteristic as shown in FIGS. 12(a) and (b) is obtained. On the other hand, when the voltage V is change to negative, range Ra35' does not exhibit the negative resistance characteristic but the characteristic that the current value is almost fixed. Ranges Ra34' and Ra36' show basically the same characteristics as ranges Ra34 and Ra36 of FIG. 12(b).

In the first to third embodiments, their respective nonlinear elements have been explained in structure. Each element is a tunnel diode which makes use of the resonance tunnel effect and which has in its insulating layer an impurity atom layer having an impurity level.

Ions of a transition metal is preferable as impurity ions to form an impurity atom layer. The reason is given as follows.

Figure 13A:
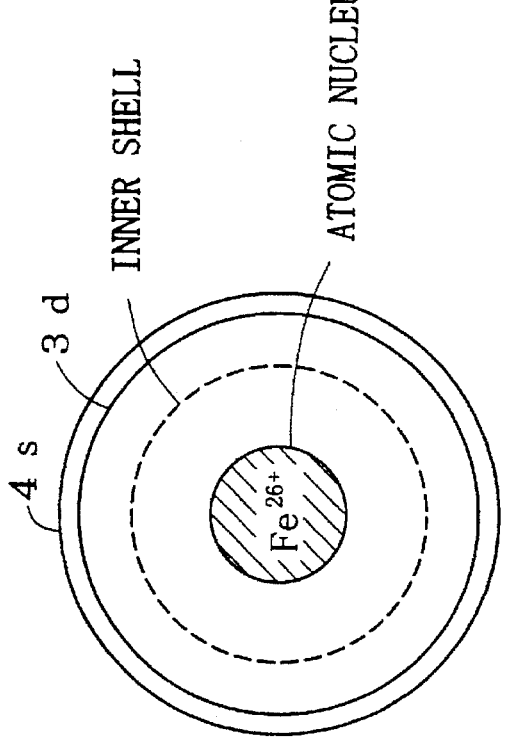
FIGS. 13(a) and 13(b) are diagrams showing an iron atom model and an electron arrangement, respectively.

A transition element is defined as an atom having an incompletely-filled d (or f) shell or as an element that generates a positive ion similar thereto (IIIA-VIIA elements, VIII elements, and IB elements), and generally shows various valences. Because of this, the correlation between electrons in the atom is not very strong and the transfer of electrons is easily made. For example, an atom of Fe (iron) holds a specific number of electrons, six in the d orbit of the M shell and two in the 4s orbit of the N shell (see FIG. 13(a)).

Figure 13B:
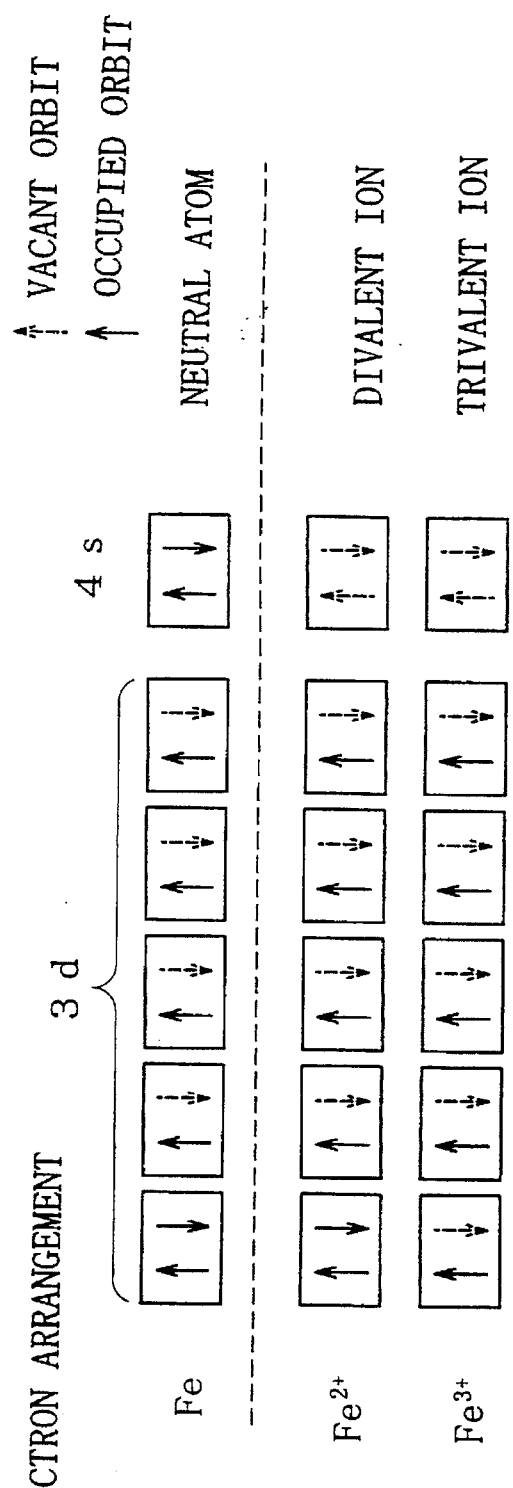

$Fe_2O_3$, the oxide of Fe, comprises Fe in the form of a divalent ion. $Fe_3O_4$, the oxide of Fe, comprises Fe in the form of a trivalent ion. FIG. 13(b) shows a neutral atom of Fe, the placement of electrons of a divalent ion in the 3d orbit, and the placement of electrons of a trivalence ion in the 4s orbit. As can be seen by making reference to the electron placement in FIG. 13(b), the difference in energy levels between divalent ion and trivalent ion is not very great from the Hund rules. This is explained as follows. Orbits that agree in spin orientation are filled with electrons in preference to other orbits. Even if an orbit having a different spin orientation is filled with an electron, the electron is ejected immediately. Therefore, if a virtual level for a trivalence ion (the entry of an atom to the level makes a change to a divalent ion) is used as an impurity level, this makes it possible to provide a structure capable of creating resonance tunneling by application of an extremely low voltage.

Of various transition metals, Mn, Fe, Cr, Ni, Cu, Sm, Eu, Gd, Yb, Lu, and Ce are preferable, since these elements are able to take two different valences, two and three or one and two.

For example, for the case of iron, even when Fe that exists in the form of a trivalence ion is changed to a divalent ion by adding one more electron thereto, the difference in energy level between them is not very great (see FIG. 14(a)). Accordingly, even when the voltage V0 applied from the outside is small, resonance tunneling occurs. This makes it possible to provide a practical nonlinear element having resonance tunneling characteristics.

However, the adding of one electron to an impurity level of the impurity atom layer may produce a great shift in atom energy level, therefore providing a nonlinear element that is poor in practical use. For example, the addition of one electron may present the problem that it is not until the applied voltage is increased up to 30 V that resonance tunneling occurs (see FIG. 14(b)). However, if a voltage of 30 V is applied, this practically reduces the barrier height of the insulating layer. As a result, both the probability that electrons jump over the insulating layer and the probability that FN tunnelling occurs increase. This greatly reduces the negative resistance region (see FIG. 14(b)). Therefore, the electron energy level shift must be held within a several volts at most. Transition metal has the advantage that, even when its impurity level is filled with an electron, it undergoes no great energy level shift. For this reason, the transition metal is a suitable material for forming an impurity atom layer.

The reason of why an electron must enter in a vacant orbit of an impurity atom is explained. For example, in a situation shown in FIG. 3(c), an electron moves from the semiconductor layer 10 to an impurity level of the impurity atom layer 11a of the insulating layer 11 by resonance tunneling and thereafter passes through the insulating layer 11 by the tunnelling effect to the metallic layer 12. If, during this process, no electron enters the vacant orbit of the impurity atom layer 11a, then there is no electron movement from EF1 (the semiconductor layer's 10 fermi level) to Eva (the impurity level). Therefore, the entry of an electron to an impurity level of an impurity atom is a condition that there is a tunnel current flow.

If a transition metal is used as the impurity ion, this allows for an electron to easily enter Eva (the impurity level) through the insulating layer 11, for the tendency toward ionization of the transition metal is stronger than that of the insulating layer 11. This provides a resonance tunnel diode having the negative resistance characteristic in the low-voltage range.

When the insulating layer is formed of either oxide, nitride, or fluoride, it is preferred that atoms, whose ionization tendency is stronger than the atoms of oxygen, nitrogen, and fluorine, are used to form an impurity atom layer. The reason for this is that if an impurity element, the ionization tendency of which is weaker than that of these elements, is used for impurity atom layer formation, electrons are immediately taken away by the oxygen, by the nitrogen, or by the fluorine. As a result, the nonlinearity of the present invention may not be obtained. The transition metal exhibits an ionization tendency stronger than oxide, nitride, and fluoride and therefore is suitable for impurity atom layer formation.

Embodiment 4

Figure 15A:
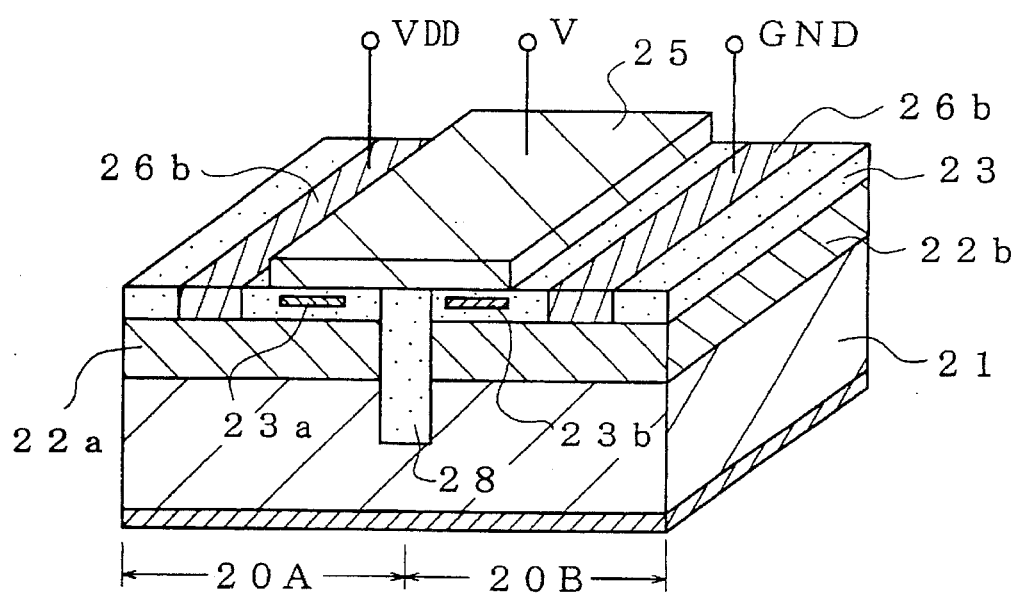
FIG. 15(a) is a perspective view illustrating a bistable memory device in accordance with a fourth embodiment of the present invention.

A fourth embodiment of the present invention is described which pertains to a bistable memory device. Referring to FIG. 15(a), a bistable memory device made in accordance with the present embodiment is an integrated device of first and second nonlinear elements 20A and 20B having a structure according to the first embodiment. As shown in FIG. 15(a), the first (second) nonlinear element 20A (20B) comprises (a) an n-type impurity diffusion layer 22a (22b) which is a first conductive layer, (b) an insulating layer 23 of $SiO_2$ formed over the n-type diffusion layers 22a and 22b, (c) an impurity atom layer 23a (23b) formed within the insulating layer 23, (d) a first aluminum electrode 25 formed on the insulating layer 23 and which is a second conductive layer common to both the nonlinear elements, and (e) a second aluminum electrode 26a (26b) in ohmic contact with the n-type diffusion layer 22a (22b). The first and second nonlinear elements 20A and 20B are separated by an isolator 28. Formed on the backside of the p-type polysilicon substrate is the backside electrode 27. Although not shown in the figure, the top of the bistable memory device is covered with a passivation film.

Figure 15B:
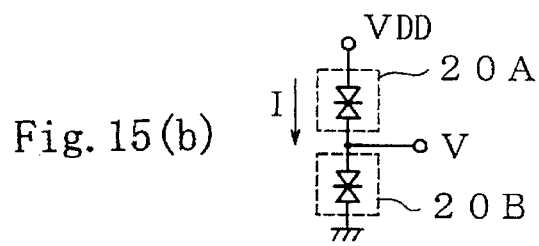
FIG. 15(b) shows a circuit diagram thereof.

FIG. 15(b) is an electric circuit diagram of the present bistable memory device. The first aluminum electrode 25 (i.e., the second conductive layer common to the elements 20A and 20B) is provided so that the present bistable memory device has a structure in which the two nonlinear elements are interconnected in series and their V-I characteristics become symmetric. The electrical characteristic of the bistable memory device is described below.

In a situation shown in FIG. 15(b), a positive voltage, VDD, is applied to the second aluminum electrode 26a of the first nonlinear element 20A and the second aluminum electrode 26b of the second nonlinear element 20B is coupled to ground. Because the positive voltage is applied to the semiconductor layer shown in FIG. 3(a), an electric current, which corresponds to the V-I characteristic on the negative side where the voltage V is negative (see FIG. 4), flows in the first nonlinear element 20A. On the other hand, because the positive voltage is applied to the metallic layer shown in FIG. 3(a), an electric current, which corresponds to the V-I characteristic on the positive side where the voltage V is positive, flows in the second nonlinear element 20B.

Figure 15C:
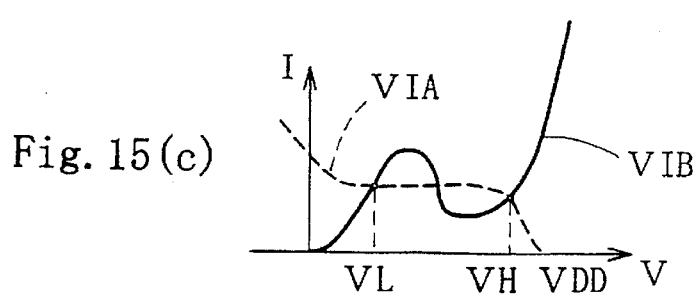
FIG. 15(c) shows the V-I characteristic thereof.

As a result of the above, the present bistable memory device operates according to a characteristic curve VIA and a characteristic curve VIB shown in FIG. 15(c). More specifically, the second nonlinear element 20B operates according to VIB which is the same as the V-I characteristic curve on the positive side shown in FIG. 3(a) for the voltage V at the first aluminum electrode On the other hand, the first nonlinear element 20A becomes a load, and a point where V becomes VDD corresponds to a zero voltage point (origin) shown in FIG. 3(a). The negative-side V-I characteristic curve is inverted using VDD as the reference point, to form the curve VIA which is a load curve of the present bistable memory device. As can be seen from FIG. 15(c), there are three intersections of VIA and VIB at which a current flowing in the element 20A and another flowing in the element 20B are the same. However, stability exists only at two of the three intersections, VL and VH. The intermediate of the three intersections is unstable so that it easily changes to VL when decreased slightly, and to VH when increased. In this way, the voltage V at the junction becomes bistable thereby providing stable memory effects against external distortion, the reason for which is described in detail later.

Figure 16:
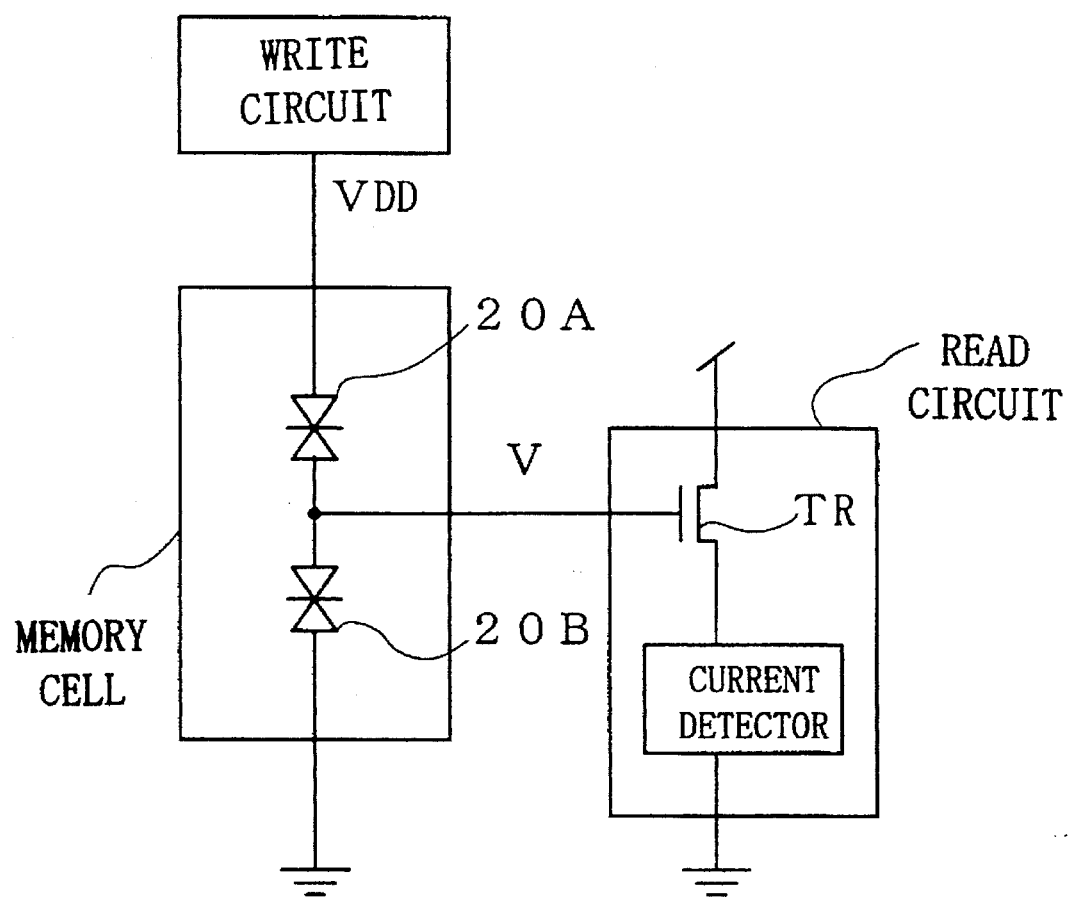
FIG. 16 is a circuit diagram showing an electric circuit for the write and read of data into and from a bistable memory device of the fourth embodiment.

FIG. 16 is a diagram of a circuit for writing and reading data in and from a memory in which a bistable memory device of the present embodiment is employed as a memory cell. Either a signal (e.g., a low-voltage signal) corresponding to MEMORY 0 or a signal (e.g., a high-voltage signal) corresponding to MEMORY 1 is applied as VDD to the memory cell from a write circuit. A state, in which the potential V at the intermediate intersection is stable at the low potential VL, can easily be written into the memory cell as DATA 0. On the other hand, a state, in which the potential V at the intermediate node is stable at the high potential VH, can easily be written to the memory cell as DATA 1. In the read circuit, the potential V is applied to the gate of a transistor TR having, for example, a threshold between VH and VL, to determine whether the transistor TR is in the state of ON or OFF. This facilitates the process of reading data. Write and read circuits other than the ones shown in FIG. 16 may be used.

The present bistable memory device has the above-described two nonlinear elements having a planar structure so that it is able to perform functions equivalent to SRAM. In comparison with current SRAMs composed of four elements, the level of density can be improved by the present embodiment. Additionally, each of the nonlinear elements employs an MIS structure, which means that they can be formed in the same fabrication process as MISFET is formed. Further, the present nonlinear element has a simple structure and requires no compound semiconductor. The present embodiment is able to provide an inexpensive, high-density bistable memory device capable of performing functions equivalent to SRAM.

Embodiment 5

Figure 17A:
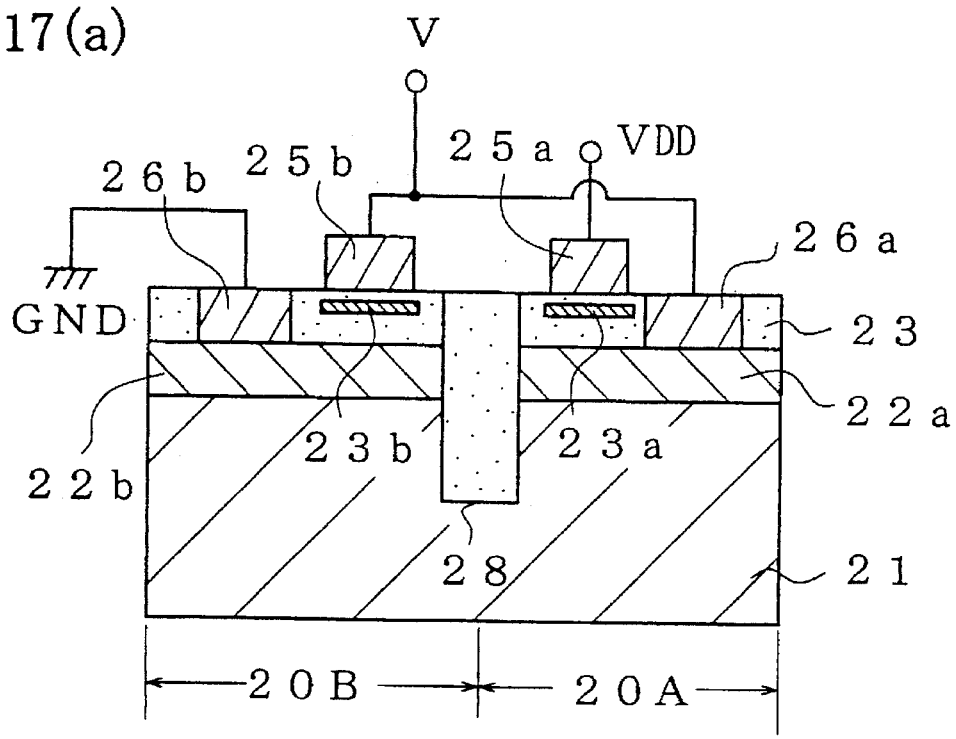
FIG. 17(a) is a perspective view illustrating a bistable memory device in accordance with a fifth embodiment of the present invention.

A fifth embodiment of the present invention is described. FIG. 17(a) shows in cross section a bistable memory device made in accordance with the fifth embodiment. The bistable memory device is an integrated device of the first and second nonlinear elements 20A and 20B having a structure according to the first embodiment. As shown in FIG. 17(a), the first (second) nonlinear element 20A (20B) comprises (a) the n-type impurity diffusion layer 22a (22b) (the first conductive layer), (b) the $SiO_2$ insulating layer 23 formed over the n-type diffusion layers 22a and 22b, (c) the impurity atom layer 23a (23b) formed within the insulating layer 23, (d) the first aluminum electrode 25a (25b) (the second conductive layer) formed on the insulating layer 23a (23b), and (e) the second aluminum electrode 26a (26b) in ohmic contact with the n-type diffusion layer 22a (22b). The first and second nonlinear elements 20A and 20B are separated by an isolator 28. Although not shown in the figure, the top of the bistable memory device is covered with a passivation film.

The first aluminum electrode 25b of the second nonlinear element 20B and the second aluminum electrode 26a of the first nonlinear element 20A are interconnected. The second aluminum electrode 26b of the second nonlinear element 20B is coupled to ground. VDD (positive) is applied to the first aluminum electrode 25a of the first nonlinear element 20A.

Figure 3A:
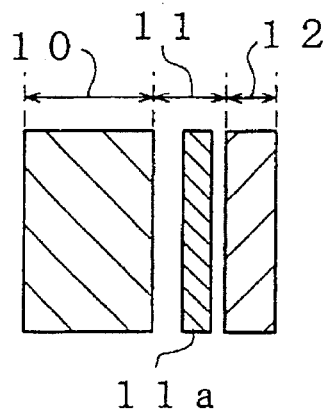
FIGS. 3(a)–3(d) are diagrams including a basic structure diagram and energy band diagrams useful in understanding the operation principle of a nonlinear element of the first embodiment.
Figure 3B:
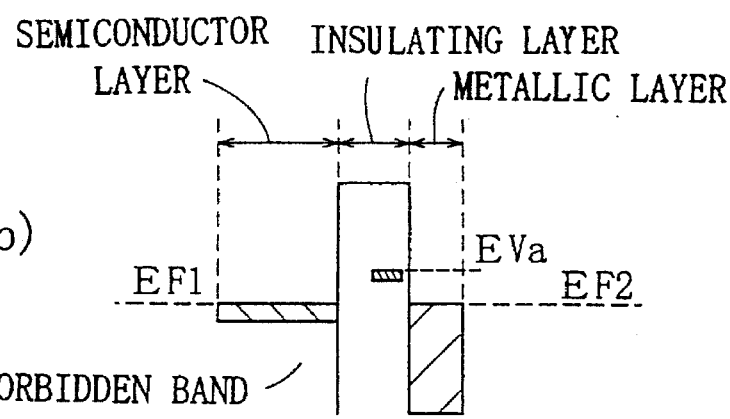
Figure 3C:
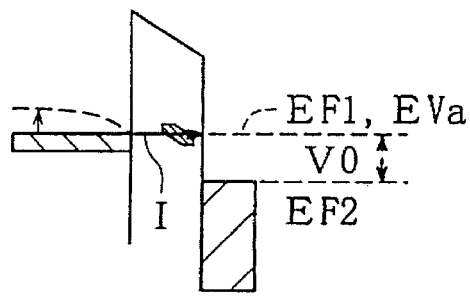
Figure 3D:
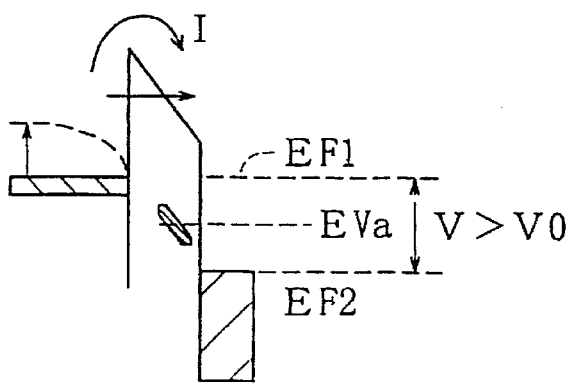
Figure 4:
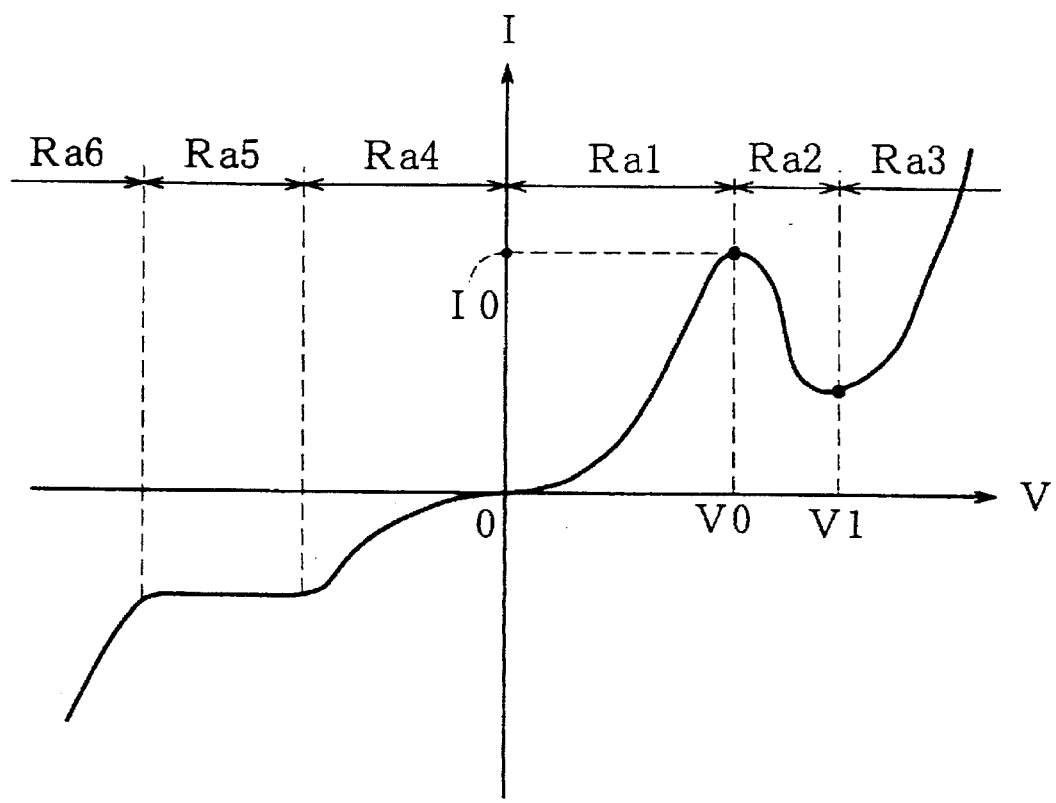
FIG. 4 shows the V-I characteristic of a nonlinear element of the first embodiment.
Figure 17B:
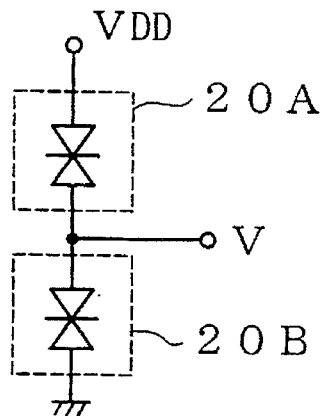
FIG. 17(b) shows a circuit diagram thereof.

Referring to FIG. 17(b), in the bistable memory device of the present embodiment a positive voltage is applied to the metallic layer shown in FIG. 3(a) in the first nonlinear element 20A as well as in the second nonlinear element 20B. As a result, there is an electric current flow according to the V-I characteristic on the positive side.

Figure 17C:
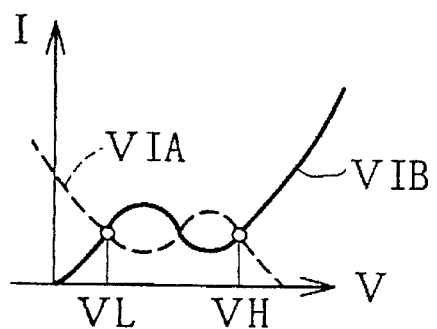
FIG. 17(c) shows the V-I characteristic thereof.

The bistable memory device of the present embodiment operates according to the characteristic curves VIA and VIB shown in FIG. 17(c). In the circuit of the present bistable memory device, the second nonlinear element 20B operates in the same way as it operates in the fourth embodiment. The load curve by the first nonlinear element 20A becomes VIA. This VIA curve is a curve as a result of symmetrically shifting the positive-side V-I characteristic curve shown in FIG. 3(a) with respect to the current axis and shifting the origin to the point VDD. Also in the present embodiment, as shown in FIG. 17(c), there are three intersections at which the current I meets the condition. However, only two points, VL and VH, are stable, in other words the voltage V at the intermediate node becomes bistable and there are stable memory effects against external distortion, as in the bistable memory device of the fourth embodiment.

By adding a bistable memory device of the present embodiment, as a memory cell, to a write circuit or read circuit, functions equivalent to SRAM can be obtained. Therefore the present embodiment is able to provide an inexpensive, high-density bistable memory device having functions equivalent to SRAM.

Embodiment 6

A sixth embodiment of the present invention is now described.

Figure 18A:
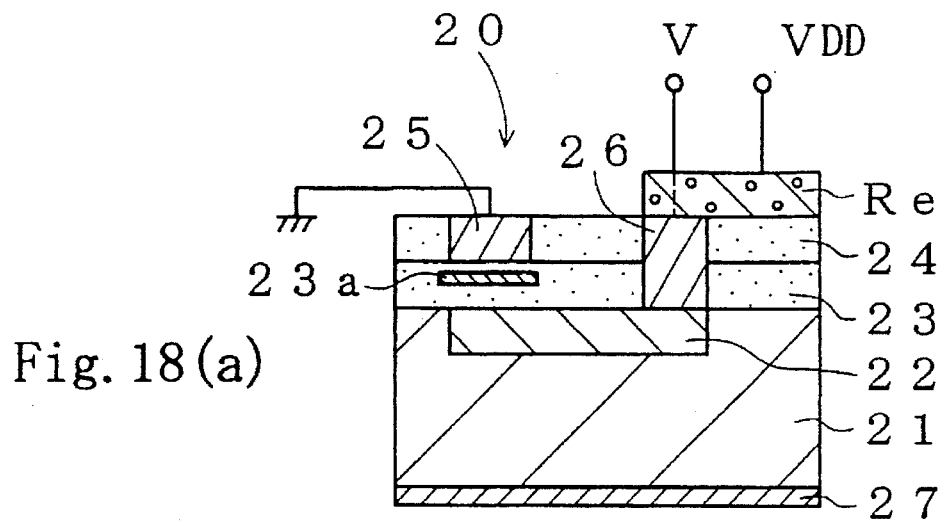
FIG. 18(a) is a perspective view illustrating a bistable memory device in accordance with a sixth embodiment of the present invention.

Referring to FIG. 18(a), a bistable memory device of the present embodiment is composed of the nonlinear element 20 having a structure shown in FIG. 2 and a resistance element Re. As in the first embodiment, the p-type silicon substrate 21, the n-type diffusion layer 22 (the first conductive layer), the insulating layer 23, the first aluminum electrode 25 (the second conductive layer), the impurity atom layer 23a, the second aluminum electrode 26 in contact with the n-type diffusion layer 22, the passivation film 24, and the backside electrode 27, are provided to form the nonlinear element 20.

The present embodiment is characterized in that the resistance element Re of polysilicon implanted with n-type impurities is formed on the second aluminum electrode 26. VDD (positive) is applied to the resistance element Re and the first aluminum electrode 25 of the nonlinear element 20 is connected to ground.

Figure 18B:
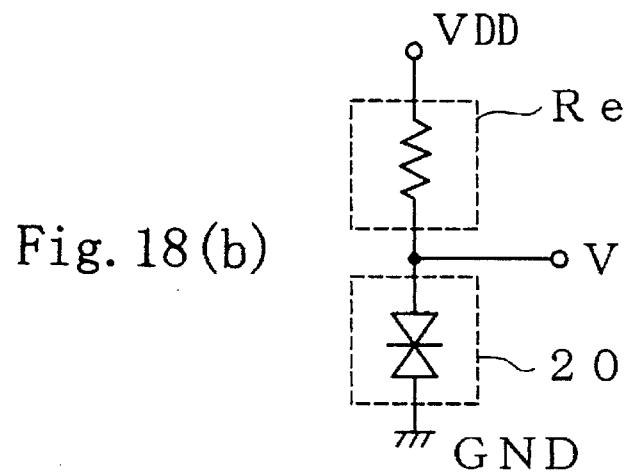
FIG. 18(b) shows a circuit diagram thereof.

FIG. 18(b) shows an electric circuit of the present bistable memory device. Also in the present bistable memory device, the potential V of the second aluminum electrode 26 which is an intermediate node between the nonlinear element 20 and the resistance element Re, is used for data storage.

Figure 18C:
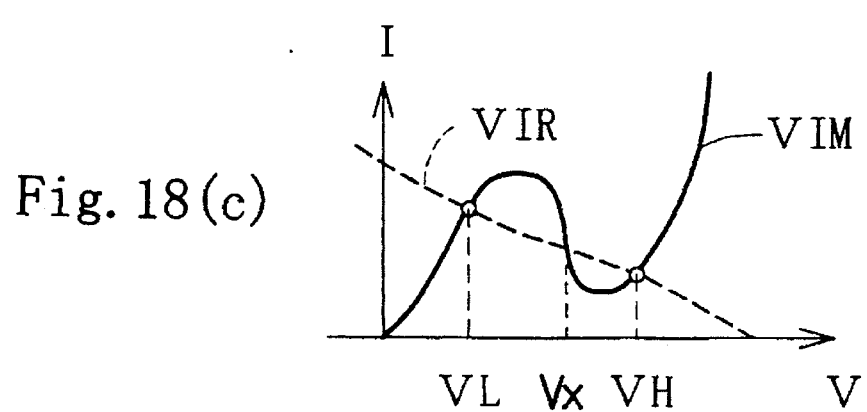
FIG. 18(c) shows the V-I characteristic thereof.

As shown in FIG. 18(c), the nonlinear element 20 exhibits a characteristic curve VIM that is the same as the positive-side V-I characteristic curve shown in FIG. 4 and the load curve is a characteristic curve VIR that is the same as the load characteristic of general resistance elements.

In the present embodiment, there are three intersections of the load curve of which VL and VH are a stable point, because of the polysilicon resistance load. The present embodiment provides a device capable of acting as a bistable memory.

As the value of the polysilicon resistance increases, the inclination of the load line decreases. This makes it possible to increase the difference between VL and VH.

Here, the following is why the memory device of the present embodiment performs bistable memory functions.

With the memory device formed on the semiconductor substrate, in a circuit shown in FIG. 18(b) the nonlinear element 20 and capacitance C exist, in parallel relationship, between the intermediate node between the resistance element Re and the nonlinear element 20 and the ground. If the current i flowing in the circuit is f(V), then the following formula holds.

$$(VDD-V)/R = f(V) \qquad (1)$$

As shown in 18(c), this formula (1) has three solutions, VL, VX, and VH. Because of the existence of capacitance C between the intermediate node and ground, the following formula holds.

$$(VDD-V)/R = C(dV/dt) + f(V)$$

If $V = V_i + \Delta V$, then $|\Delta V| \ll V_i$ (i=L, X, H) which can be transformed into the following formula:

$$(VDD-V_i)/R - (\Delta V/R) = C(d\Delta V/dt) + f(V_i + \Delta V) = -C(d\Delta V/dt) + f(V_i) + (\alpha f/\alpha V)_{V=V_i} \cdot \Delta V$$

where "≈" in the equation means "approximately equal" and "α" means the partial difference.

Vi is a solution of Eq. (1) so that the following equation holds.

$$-(\Delta V/R) = C(d\Delta V/dt) + (\alpha f/\alpha V)_{V=V_i} \cdot \Delta V$$

If the solution of this differential equation is solved with respect to ΔV, the following is obtained.

$$\Delta V = A \exp[-(1/C)\{(1/R) + (\alpha f/\alpha V)\}t] \qquad (2)$$

Note: A=ΔV (0) (initial value)

If V=VL, VH, then (αf/αV)>0, from which it follows that (1/R)+(αf/αV)>0. From the equation (2), it can be seen that as t increases, or as time lapses, ΔV approaches 0.

If V=VX, then (αf/αV)<0 and |(αf/αV)>1/R. As a result, it holds that (1/R)+(αf/αV)<0. The equation (2) shows that if t increases, ΔV changes positively or negatively depending on the sign of the initial value A to move to a point corresponding to VL or VH. From this it can be seen that the point corresponding to VX is an unstable point.

For the sake of calculation simplicity, the description has been made with respect to the stability of the intersections VL and V of the bistable memory device of the present invention. It is possible to prove that each of VL and VH of the bistable memory devices of the fourth and fifth embodiments is a stable point.

Embodiment 7

Figure 19:
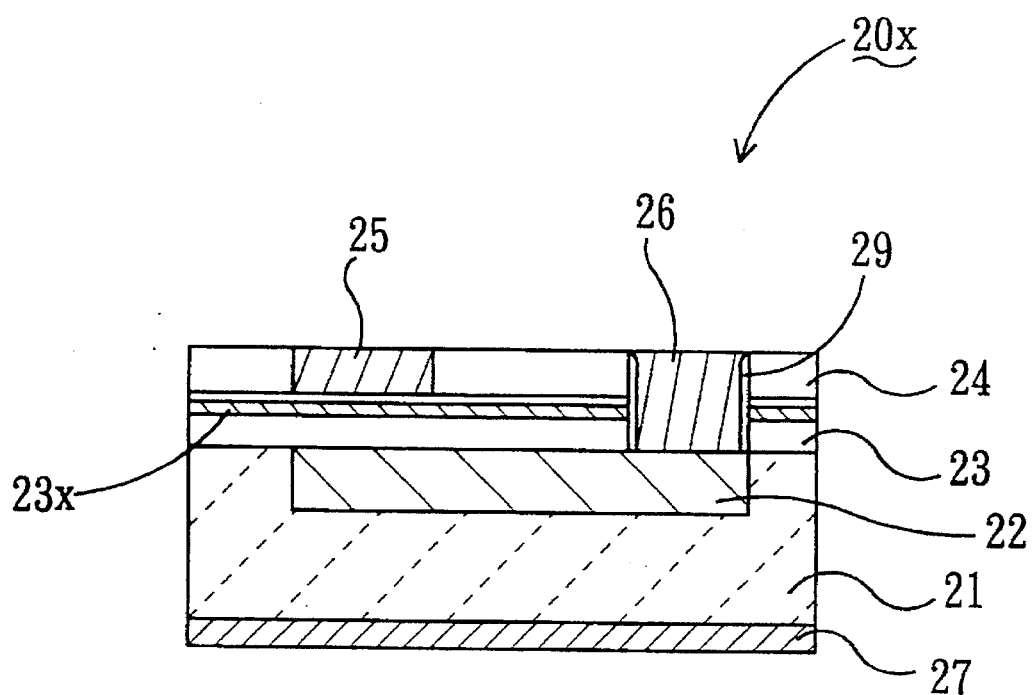
FIG. 19 shows in cross section a nonlinear element in accordance with a seventh embodiment of the present invention.

A seventh embodiment of this invention is explained now. FIG. 19 shows in cross section a structure of a nonlinear element 20x made in accordance with the seventh embodiment. Like the nonlinear element 20 of the first embodiment (see FIG. 2), the nonlinear element 20x has the p-type silicon substrate 21, the n-type diffusion layer 22, the insulating layer 23, the passivation layer 24, the first aluminum electrode 25, the second aluminum electrode 26, and the backside electrode 27. Therefore the present embodiment is basically identical in structure with the first embodiment.

The nonlinear element 20x is characterized in that an impurity atom layer 23x, formed by means of implantation of a metal having an impurity level, is applied onto the entire surface of the insulating layer 23. A contact hole is formed through the insulating layer 23 and passivation film 24. A sidewall 29 is formed in the contact hole. It is arranged such that a buried portion of the second aluminum electrode 26 and the impurity atom layer 23x are separated from each other by the sidewall 29.

The present embodiment is able to provide a nonlinear element capable of performing the same functions as the nonlinear element of the first embodiment and to provide a bistable memory device identical with the one made in accordance with the first embodiment.

Other Embodiments

In each of the above-described embodiments metallic layers are used. A polysilicon film doped with impurities may be employed instead. Particularly, for the case of MOS transistors, a polysilicon film is used to form the gate electrode. The polysilicon film can be formed at the same fabrication step as the gate electrode.

Additionally, instead of the silicon electrode 95 of the third embodiment, a polysilicon electrode may be provided. For the case of a polysilicon film, it is possible to allow the polysilicon film to exhibit a property similar to single crystal silicon by controlling its crystal grain size and impurity concentration. This provides the same effect as the third embodiment.

If in each embodiment a plurality of impurity layers are formed in the insulating layer and a plurality of negative-resistance regions are formed, this provides the function of holding not only binary data (0, 1) but also ternary data.

In each embodiment of this invention the insulating layer is formed of a silicon oxide film. Instead of the silicon oxide film, a silicon nitride film or calcium fluoride film may be useful. Material for the insulating layer can be selected according to the type of impurity forming the impurity atom layer and according to the fabrication process.

In each embodiment of this invention, the insulating layer is formed of a single film (i.e., a silicon oxide layer). The insulating layer may be formed of a film formed of different two materials separated by the impurity atom layer. A region having a memory function may be formed by a laminated structure (e.g., a silicon layer-silicon oxide film-impurity atom layer-silicon nitride film-aluminum electrode structure).

The invention claimed is:

1. A nonlinear element with a negative resistance characteristic comprising:
    a first conductive layer which has a first fermi level;
    a second conductive layer which has a second fermi level at the same energy level as said first fermi level when no voltage is applied;
    an insulating layer which is formed between said first and second conductive layers and which has a barrier level at an energy level higher than said first and second fermi levels when no voltage is applied;
    an impurity layer;
    said impurity layer being formed within said insulating layer so as to be a predetermined distance from at least said first conductive layer or said second conductive layer;
    said impurity layer containing an impurity element having in any of its shells a vacant orbit not filled with an electron;
    said impurity layer having an impurity level that is an energy level for filling said vacant orbit and is higher than said first fermi level but lower than said barrier level;
    wherein, when a given voltage is applied between said first and second conductive layers, an electron transfer occurs between the lower in voltage of said two conductive layers and said impurity layer by resonance tunnelling.

2. A nonlinear element with a negative resistance characteristic according to claim 1 wherein one of said first and second conductive layers is composed of a semiconductor and the other conductive layer is composed of a metal.

3. A nonlinear element with a negative resistance characteristic according to claim 2 wherein said impurity layer is formed in close proximity to said metallic conductive layer.

4. A nonlinear element with a negative resistance characteristic according to claim 1 wherein each said conductive layer is composed of a metal.

5. A nonlinear element with a negative resistance characteristic according to claim 1 wherein each said conductive layer is composed of a semiconductor.

6. A nonlinear element with a negative resistance characteristic according to claim 1 wherein said impurity element has a stronger ionization tendency than a material that forms said insulating layer.

7. A nonlinear element with a negative resistance characteristic according to claim 1 wherein said insulating layer is composed of at least one of oxide, nitride, and fluoride.

8. A nonlinear element with a negative resistance characteristic according to claim 1 wherein said impurity element is a transition metal.

9. A nonlinear element with a negative resistance characteristic according to claim 1 wherein said impurity layer is formed by implanting ions of an impurity element into said insulating layer and wherein the location and thickness of said impurity layer and the concentration of said impurity element in said insulating layer are controlled by ion implantation parameters.

10. A nonlinear element with a negative resistance characteristic according to claim 1 wherein both said insulating layer and said impurity layer are formed by CVD and wherein the location and thickness of said impurity layer and the concentration of said impurity element in said insulating layer are controlled by CVD parameters.

11. A bistable memory device comprising a load element and a drive element wherein said load and drive elements are arranged in series in that order between a first power source for supplying a higher voltage and a second power source for supplying a lower voltage,
    said drive element including:
        a first conductive layer which has a first fermi level;
        a second conductive layer which has a second fermi level at the same energy level as said first fermi level when no voltage is applied and which is connected to said load element;
        an insulating layer which is formed between said first and second conductive layers and which has a barrier level at an energy level higher than said first and second fermi levels when no voltage is applied;
    an impurity layer;
    said impurity layer being formed in said insulating layer;
    said impurity layer containing an impurity element having in any of its shells a vacant orbit not filled with an electron;

said impurity layer having an impurity level which is an energy level for filling said vacant orbit and is higher than said first fermi level but lower than said barrier level wherein, when a voltage that increases the potential of said second conductive layer is applied between said first and second conductive layers and is increased, a negative-resistance characteristic, associated with a transition from the state of resonance to the state of non-resonance between said first conductive layer and said impurity layer, is exhibited in a specific voltage range;

wherein a voltage of an intermediate point between said drive element and said load element is one of voltages at two stable points corresponding to intersections of voltage-current characteristic curves of said drive and load elements.

12. A bistable memory device according to claim 11 wherein said first conductive layer of said drive element is composed of a semiconductor and wherein said second conductive layer of said drive element is composed of a metal.

13. A bistable memory device according to claim 12 wherein said impurity layer of said drive element is formed in closer proximity to said second conductive layer than to said first conductive layer.

14. A bistable memory device according to claim 12 wherein said load element has a first conductive layer, a second conductive layer, an insulating layer, and an impurity layer so that said load element becomes identical in structure with said drive element.

15. A bistable memory device according to claim 14 wherein said first conductive layer of said load element is connected to said first power source and wherein said second conductive layer of said load element is connected to said second conductive layer of said drive element.

16. A bistable memory device according to claim 14 wherein said second conductive layer of said load element is connected to said first power source and wherein said first conductive layer of said load element is connected to said second conductive layer of said drive element.

17. A bistable memory device according to claim 11 wherein each said conductive layer of said drive element is composed of a semiconductor.

18. A bistable memory device according to claim 17 wherein said load element has a first conductive layer, a second conductive layer, an insulating layer, and an impurity layer so that said load element becomes identical in structure with said drive element.

19. A bistable memory device according to claim 11 wherein said load element is composed of a resistor.

20. A nonlinear element according to claim 1, wherein the insulating layer comprises: a first insulating layer adjacent to the first conductive layer; a second insulating layer adjacent to the second conductive layer; and a third insulating layer interposed between the first and second insulating layers, and said impurity layer being formed within the third insulating layer.

21. A nonlinear element according to claim 20, wherein said impurity element is a transition metal.

22. A nonlinear element according to claim 21, wherein said transition metal comprises $F_e$ so that the impurity layer contains iron oxide.

23. A nonlinear element according to claim 8, wherein said transition metal comprises $F_e$ so that the impurity layer contains iron oxide.

* * * * *